(12) United States Patent
Little et al.

(10) Patent No.: US 6,665,109 B2
(45) Date of Patent: Dec. 16, 2003

(54) COMPLIANT MECHANISM AND METHOD OF FORMING SAME

(75) Inventors: Michael J. Little, Oak Park, CA (US); Thomas S. Tyrie, Oak Park, CA (US); William P. Eaton, Thousand Oaks, CA (US); John J. Lyon, San Marcos, CA (US)

(73) Assignee: NP Photonics, Inc., Tucson, AZ (US)

(*) Notice: Subject to any disclaimer, the term of this patent is extended or adjusted under 35 U.S.C. 154(b) by 6 days.

(21) Appl. No.: 10/085,143

(22) Filed: Mar. 1, 2002

(65) Prior Publication Data

US 2003/0011866 A1 Jan. 16, 2003

Related U.S. Application Data

(63) Continuation-in-part of application No. 09/811,612, filed on Mar. 20, 2001, now Pat. No. 6,519,074, which is a continuation-in-part of application No. 09/766,687, filed on Jan. 19, 2001, now Pat. No. 6,597,461.

(60) Provisional application No. 60/303,772, filed on Jul. 10, 2001, provisional application No. 60/284,943, filed on Apr. 20, 2001, provisional application No. 60/211,529, filed on Jun. 15, 2000, and provisional application No. 60/190,110, filed on Mar. 20, 2000.

(51) Int. Cl.[7] .................. G02B 26/00; G02B 26/08; G02B 7/02

(52) U.S. Cl. ............ 359/290; 359/291; 359/295; 359/298; 359/224; 359/814

(58) Field of Search .................. 359/290, 291, 359/295, 298, 292, 224, 226, 230, 214, 811, 813, 814, 824

(56) References Cited

U.S. PATENT DOCUMENTS

| | | |
|---|---|---|
| 4,203,128 A | 5/1980 | Guckel et al. |
| 4,400,058 A | 8/1983 | Durand et al. |
| 4,553,816 A | 11/1985 | Durand et al. |
| 4,566,935 A | 1/1986 | Hornbeck |
| 4,825,262 A | 4/1989 | Mallinson |
| 4,859,060 A | 8/1989 | Katagiri et al. |
| 5,068,861 A | 11/1991 | Abbott et al. |
| 5,313,333 A | 5/1994 | O'Brien et al. |
| 5,381,232 A | 1/1995 | van Wijk |
| 5,383,168 A | 1/1995 | O'Brien et al. |
| 5,461,507 A | 10/1995 | Westland et al. |
| 5,510,914 A | 4/1996 | Liu et al. |
| 5,561,523 A | 10/1996 | Blomberg et al. |
| 5,822,110 A | 10/1998 | Dabbaj |
| 5,917,647 A | 6/1999 | Yoon |
| 5,970,190 A | 10/1999 | Fu et al. |
| 6,078,395 A | 6/2000 | Jourdain et al. |
| 6,137,819 A | 10/2000 | Najda |
| 6,324,192 B1 | 11/2001 | Tayebati |
| 6,335,817 B1 | 1/2002 | Phillipps |
| 6,400,738 B1 | 6/2002 | Tucker et al. |
| 2002/0196521 A1 * | 12/2002 | Little et al. .......... 359/290 |

FOREIGN PATENT DOCUMENTS

| | | |
|---|---|---|
| EP | 0 702 205 A2 | 8/1995 |
| WO | WO 99/34484 | 7/1999 |

OTHER PUBLICATIONS

Joost C. Lotters et al.; "Polydimethylsiloxane as an elastic material applied in a capacitive accelerometer"; (1996); J. Micromech. Microeng. 6 (1996) pp. 52–54.

P. Bley; "Polymers—an Excellent and Increasingly Used Material for Microsystems"; Sep. 1999; SPIE vol. 3876; pp. 172–184.

(List continued on next page.)

Primary Examiner—Georgia Epps
Assistant Examiner—Jack Dinh
(74) Attorney, Agent, or Firm—Fleshner & Kim, LLP

(57) ABSTRACT

The present invention provides a compliant mechanism that can be used to make a variety of devices, such as tunable optical devices that are more reliable, more cost effective and/or exhibit better performance than prior art devices.

42 Claims, 28 Drawing Sheets

OTHER PUBLICATIONS

Thorbjorn Ebeforst et al.; "New small radius joints based on thermal shrinkage of polyimide in V-grooves for robust self-assembly 3D microstructures"; J. Micromech. Microeng. 8 (1998); pp. 188–194.

M Pedersent et al.; "A capacitive differential pressure sensor with polyimide diaphragm"; J. Micromech. Microeng. 7 (1997); pp. 250–252.

Frank Niklaus et al.; "Low-temperature full wafer adhesive bonding"; J. Micromech. Microeng. 11 (2001); pp. 100–107.

Kenji Suzuki et al.; "Insect-Model Based Microrobot with Elastic Hinges"; Journal of Microelectromechanical Systems, vol. 3, No. 1, Mar. 1994; pp. 4–9.

K. Minami et al., "Fabrication of Distributed Electrostatic Micro Actuator (DEMA)"; Journal of Microelectromechanical Systems, vol. 2, No. 3, Sep. 1993; pp. 121–127.

Cheol-Hyun Han et al.; "Parylene-Diaphragm Piezoelectric Acoustic Transducers"; The Thirteenth Annual International Conference on Microelectromechanical Systems; (2000), pp. 148–152.

Krzysztof A R B Pietraszewski et al.; "Cryogenic servo-stabilised Fabry–Perot Interferometer for imaging at 2–2.5microns"; SPIE Proceedings, vol. 2814 (1996); pp. 139–146.

T R Hicks et al.; "The application of capacitance micrometry to the control of Fabry–Perot etalons"; J. Phys. E. Instrum., vol. 17, 1984, pp. 49–55.

P. Tayebati et al.; "Widely Tunable Fabry–Perot filter Using Ga(Al)As–AlO$_x$ Deformable Mirrors"; IEEE Photonics Technology Letters, vol. 10, No. 3, Mar. 1998; pp. 394–396.

P. Tayebati et al., "Microelectromechanical tunable filters with 0.47nm linewidth and 70nm tuning range"; Electronics Letters; Jan. 8, 1998; vol. 34, No. 1; pp. 76–78.

M.C. Larson et al.; "Vertical Coupled–Cavity Microinterferometer on GaAs with Deformable–Membrane Top Mirror"; IEEE Photonics Technology Letters, vol. 7, No. 4, Apr. 1995; pp. 382–384.

K. Aratani et al.; "Process and Design Considerations for Surface Micromachined Beams for a Tunable Interferometer Array in Silicon"; Proc. IEEE Micro Electro Mechanical Systems, Ft. Lauderdal, FL, 1993, pp. 230–235.

MEM–TUNE Tunable Filter; Preliminary Data Sheet; May 2000.

OPM–1 Optical Performance Monitor; Preliminary Data Sheet; May 2000.

GTM–1 EDFA Gain–Tilt Monitor; Preliminary Data Sheet; May 2000.

J. H. Jerman et al.; "Miniature Fabry–Perot Interferometers Micromachined in Silicon for use in Optical Fiber WDM Systems"; Transducers '91, International Solid–State Conference on Sensors and Actuators, pp. 372–375 (1991) IEEE, pp. 472–475.

P. Tayebati; "Microelectromechanical tunable filter with stable haft symmetric cavity"; Electronics Letters–IEEE, 1998, p. 1967.

E. Ollier et al.; "Micro–Opto–Electro–Mechanical Systems: Recent developments and LETI's acitivities"; SPIE; vol. 4075; pp. 12–21. Sep. 2000.

T. R. Hicks et al.; "The application of capacitance micrometry to the control of Fabry–Perot etalons"; J. Phys. E: Sci. Instrum., vol. 17, 1984; pp. 49–55.

* cited by examiner

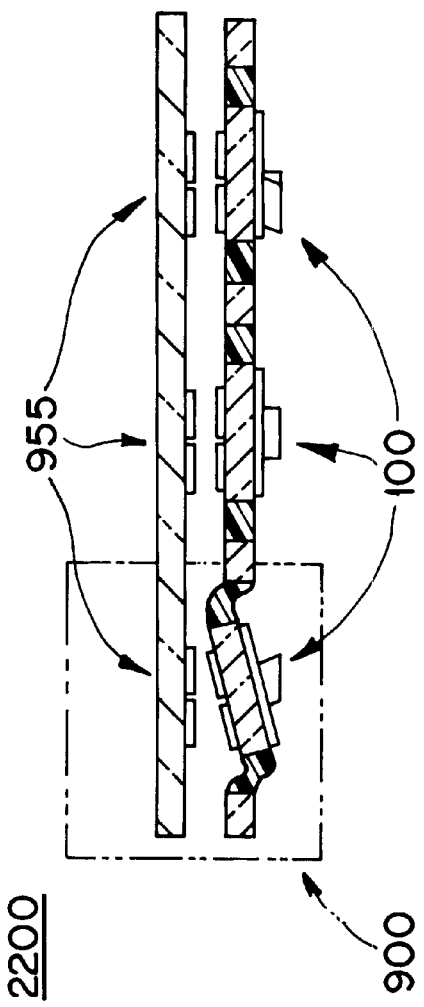
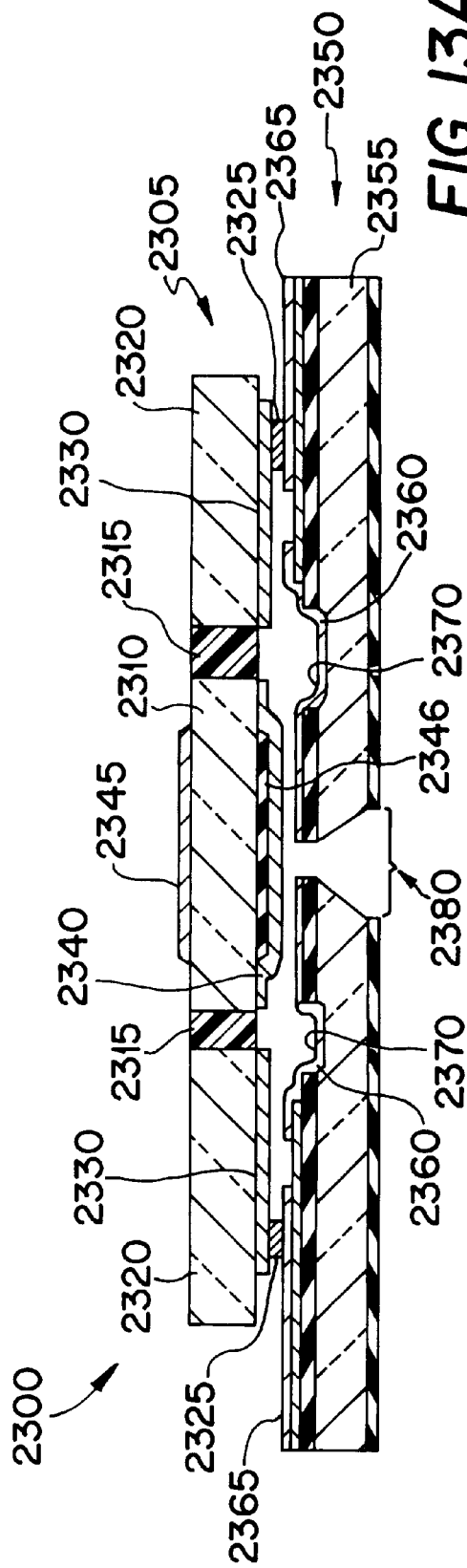
FIG. 12
FIG. 13A

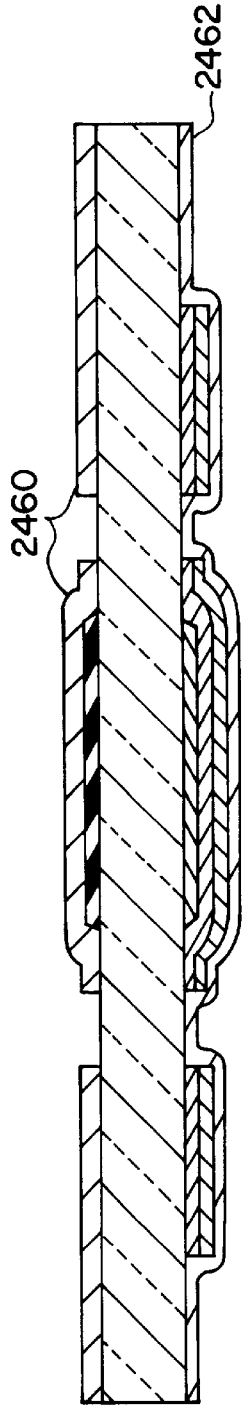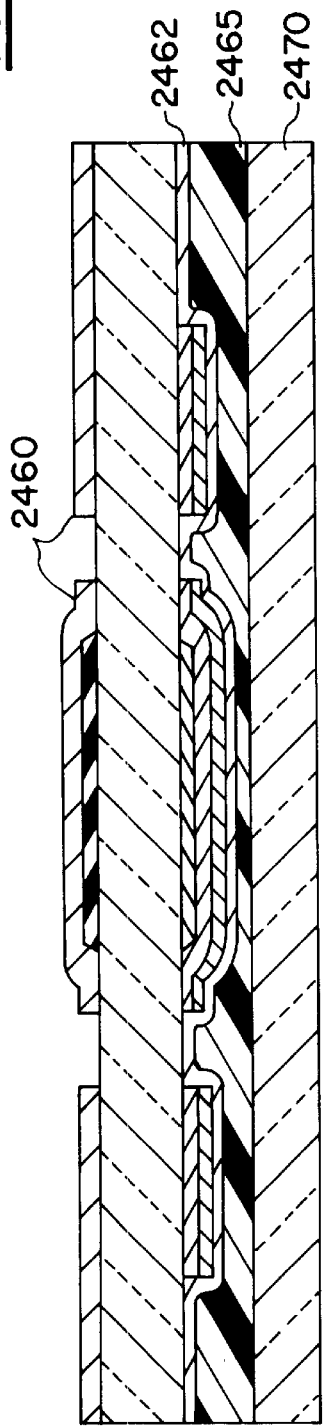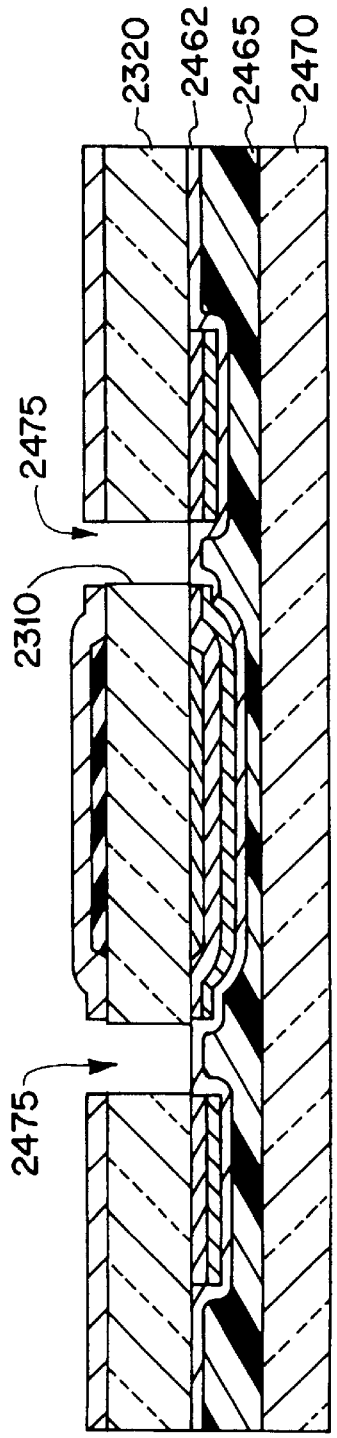

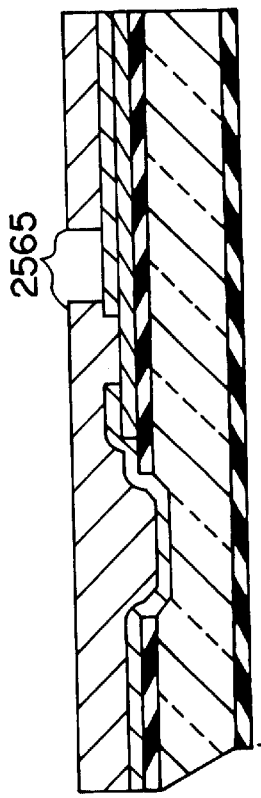
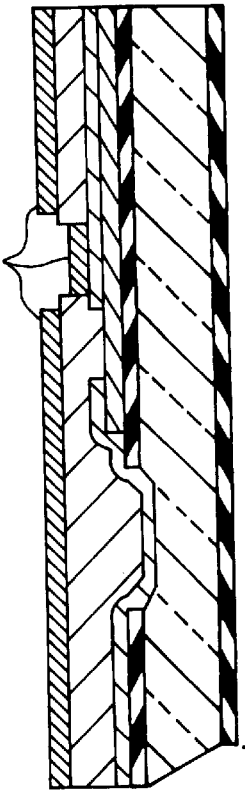
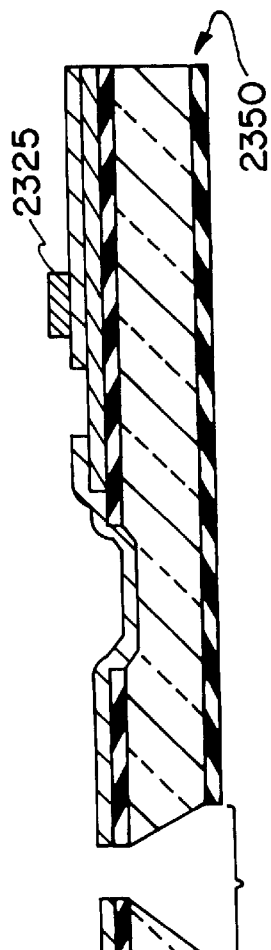
FIG. 15J
FIG. 15K
FIG. 15L
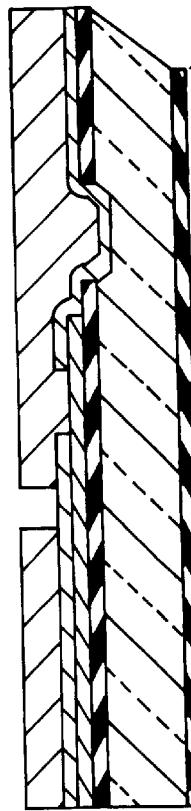
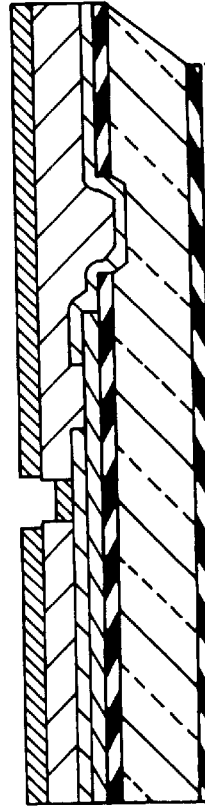
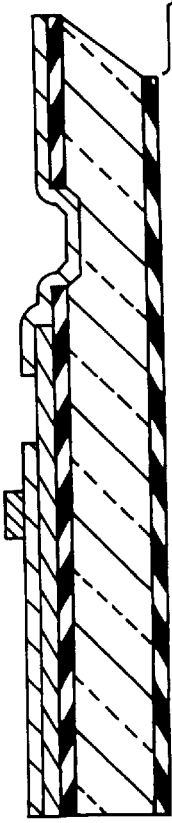

COMPLIANT MECHANISM AND METHOD OF FORMING SAME

RELATED APPLICATIONS

This application claims priority to U.S. Provisional Application Ser. No. 60/284,943, filed Apr. 20, 2001, and U.S. Provisional Application No. 60/303,772, filed Jul. 10, 2001. This application is also a continuation-in-part of U.S. patent application Ser. No. 09/811,612, entitled "Electrostatically-Actuated Tunable Optical Components Using Entropic Materials," filed Mar. 20, 2001, now U.S. Pat. No. 6,519,074 which is a continuation-in-part of U.S. patent application Ser. No. 09/766,687 entitled "Tunable Fabry-Perot Interferometer Using Entropic Materials," filed Jan. 19, 2001 now U.S. Pat. No. 6,597,461. U.S. patent application Ser. No. 09/811,612 also claims priority to U.S. Provisional Application Ser. Nos. 60/190,110, entitled "Voltage Tunable Etalon Using Compliant Microelectromechanical System (MEMS) Technology," filed Mar. 20, 2000, and 60/211,529, entitled "Elastomer Support Layer Based MEMS Devices," filed Jun. 15, 2000. All of the above applications are hereby incorporated by reference in their entirety.

BACKGROUND OF THE INVENTION

1. Field of the Invention

This invention relates to a mechanism that can be used to make a variety of devices where precise positioning of a device element is desirable. Examples include tunable optical elements such as mirrors, lenses, filters, prisms and diffraction gratings for use in tunable optical devices.

2. Background of the Related Art

There is a continuing need for precise positioning of optical elements in devices for various applications, such as optical systems including imaging systems and telecommunications networks. Such precise positioning offers benefits such as tunable devices and simplified packaging.

Existing technologies for precise positioning of optical elements are either to costly, unreliable, or do not exhibit the performance needed for present and/or future systems requirements.

SUMMARY OF THE INVENTION

An object of the invention is to solve at least the above problems and/or disadvantages and to provide at least the advantages described hereinafter.

The present invention provides a compliant mechanism that can be used to make a variety of devices that are more reliable, more cost effective and/or exhibit better performance than prior art devices. The present invention further provides an actuated compliant mechanism for precisely positioning optical elements in optical devices.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

Preferred embodiments of the invention will be described in detail with reference to the following drawings in which like reference numerals refer to like elements wherein:

FIG. 12 is a cross-sectional view of an actuated mechanism assembly, in accordance with an embodiment of the present invention;

FIG. 13A is a cross-sectional view of an electrostatically-actuated mirror, in accordance with an embodiment of the present invention;

FIGS. 15A–15L are cross-sectional views of steps one of preferred method of fabricating the actuator support of FIG. 13A;

DETAILED DESCRIPTION OF PREFERRED EMBODIMENTS

Figure 1A:
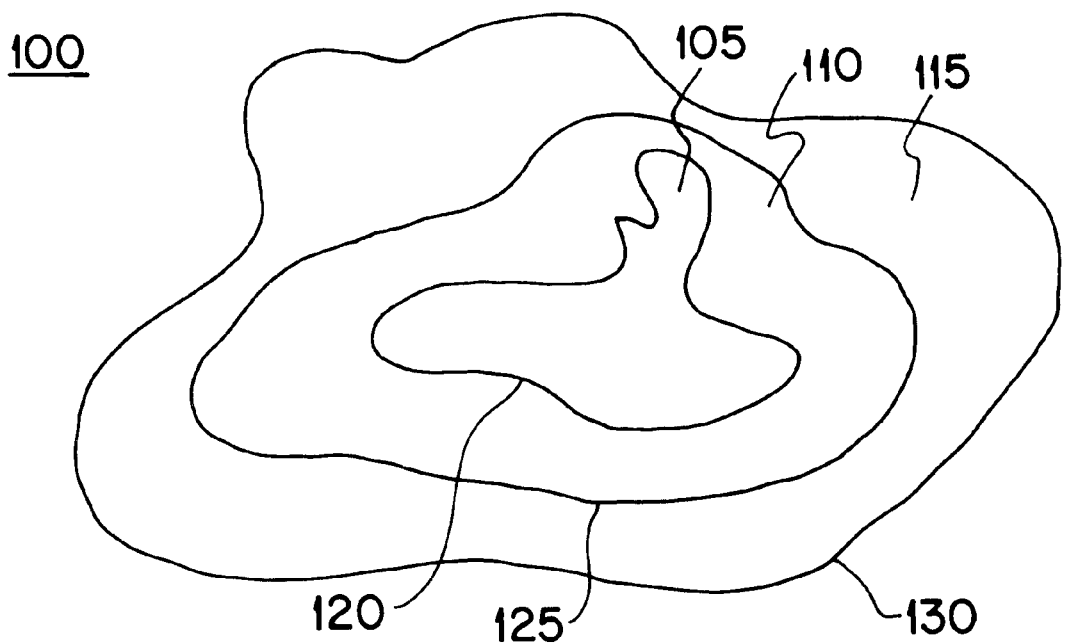
FIG. 1A schematic view of a compliant mechanism, in accordance with an embodiment of the present invention.
Figure 1B:
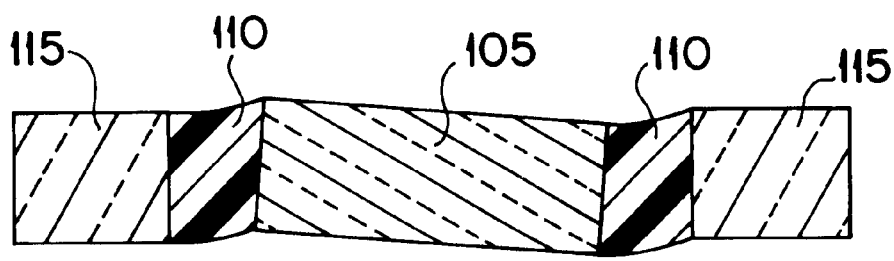
FIG. 1B is a cross-sectional view of a compliant mechanism configured to undergo principally shear-type deformation, in accordance with another embodiment of the present invention.

FIGS. 1A–1B show one embodiment of the compliant mechanism 100 of the present invention. The compliant mechanism 100 includes an island 105, which is surrounded by and connected to a compliant member 110, and the compliant member 110 is surrounded by and connected to a frame 115. The junction or interface where the island 105 meets the compliant member 110 is the first interface 120. The junction or interface where the compliant member 110 meets the frame 115 is the second interface 125. The exterior surface of the frame 115 includes an outer frame edge 130.

The island 105 is preferably formed from a material that is more rigid than the compliant member 110, and preferably has a higher Young's modulus than the compliant member 110. Examples of such materials include polymers and other organic materials. The island 105 is attached to the compliant member 110 at least at one point along the first interface 120. An advantageous feature of certain embodiments is where the island 105 is attached to the compliant member 110 all along the first interface 120. The compliant member 110 is preferably an elastic material, preferably a polymer with a Young's modulus smaller than the Young's modulus of the island 105 and frame 115, and preferably has a relatively high elastic limit. In one preferred embodiment, the Young's modulus of the compliant member 110 is preferably less than 1 G Pascal. In embodiments where it is desirable to maintain the rigidity of the island 105 while the compliant member 110 is deformed, it is preferred that the Young's modulus of the island 105 is at least two orders of magnitude larger than the Young's modulus of the compliant member 110. Materials such as elastomers can offer Young's modulus as much as five orders of magnitude less than the Young's modulus of a typical silicon substrate.

The compliant member 110 is attached to the frame 115 at least at one point along the second interface 125. The frame 115 is preferably formed from a rigid material, which may be the same material used for the island 105. The frame 115 includes an outer edge 130, which defines the outer edge of the compliant mechanism 100.

To have the capability to achieve large motion or displacements, the compliant member 110 should preferably display linear-elastic behavior over a wide range of frequencies and over a substantial portion of the deformation range at low actuation forces. Entropic materials, such as elastomers, aerogels and other long-chained polymers, are one type of material which provides such behavior.

Taking advantage of entropic materials' normal stress behavior can inhibit certain undesired motions while accomplishing the desired motion. For example, normal stresses can be used to reduce the tendency of the island 105 to tilt during longitudinal motion. To achieve this benefit, the compliant member 110 is preferably configured such that its main deformation mode is shear deformation. For example, when a unit volume of such an entropic material is subjected to shear deformation, it displays normal stresses acting perpendicular to the three orthogonal unit planes. These normal stresses are in addition to the shear stress displayed by all materials, and are a consequence of the long chain nature of the entropic material (i.e. the causality of the normal stress behavior is identical to the causality of the entropic elastic behavior). Further, the magnitude of the normal stress is proportional to the square of the shear strain, which compares to the shear stress being directly proportional to the shear strain. This feature can be used to further enhance device stability. The use of entropic materials for tunable devices is discussed in more detail in co-pending related U.S. Pat. Nos. 6,519,074 and 6,597,661, both of which are incorporated by reference in their entirety.

The term "island" is used for convenience in describing the invention and the preferred embodiments herein. The term does not imply isolation or separation from all elements of a device. Instead, it describes an element that is sufficiently separated from a support structure, such as the frame 115, so that the element can move relative to such support structure. The element may be movably or rigidly attached to one or more other elements in a device in certain embodiments, such as the embodiments shown in FIGS. 9A and 9C, which will be discussed below.

An advantageous feature of certain embodiments of the invention is that the island is capable of having individual actuators and/or sensor elements placed on the island, so that each island may be individually actuated or sensed. Providing one or more rigid, discretely controlled islands with multiple actuators and/or sensors on each island allows for precision movement and/or sensing of each island. Such embodiments are advantageous for use with optical elements, but also can be used in other applications where precession movement and/or sensing is needed.

In certain preferred embodiments of the invention, the compliant member 110 is formed by using at least a portion of the inner perimeter of the frame 115 and at least a portion of the outer perimeter of the island 105 as two sides of a mold. Compliant material can then be pour, injected or otherwise inserted into the mold in liquid or semi-liquid form and then hardened or otherwise cured prior to removing the sides of the mold other than the frame 115 and the island 105.

Figure 2:
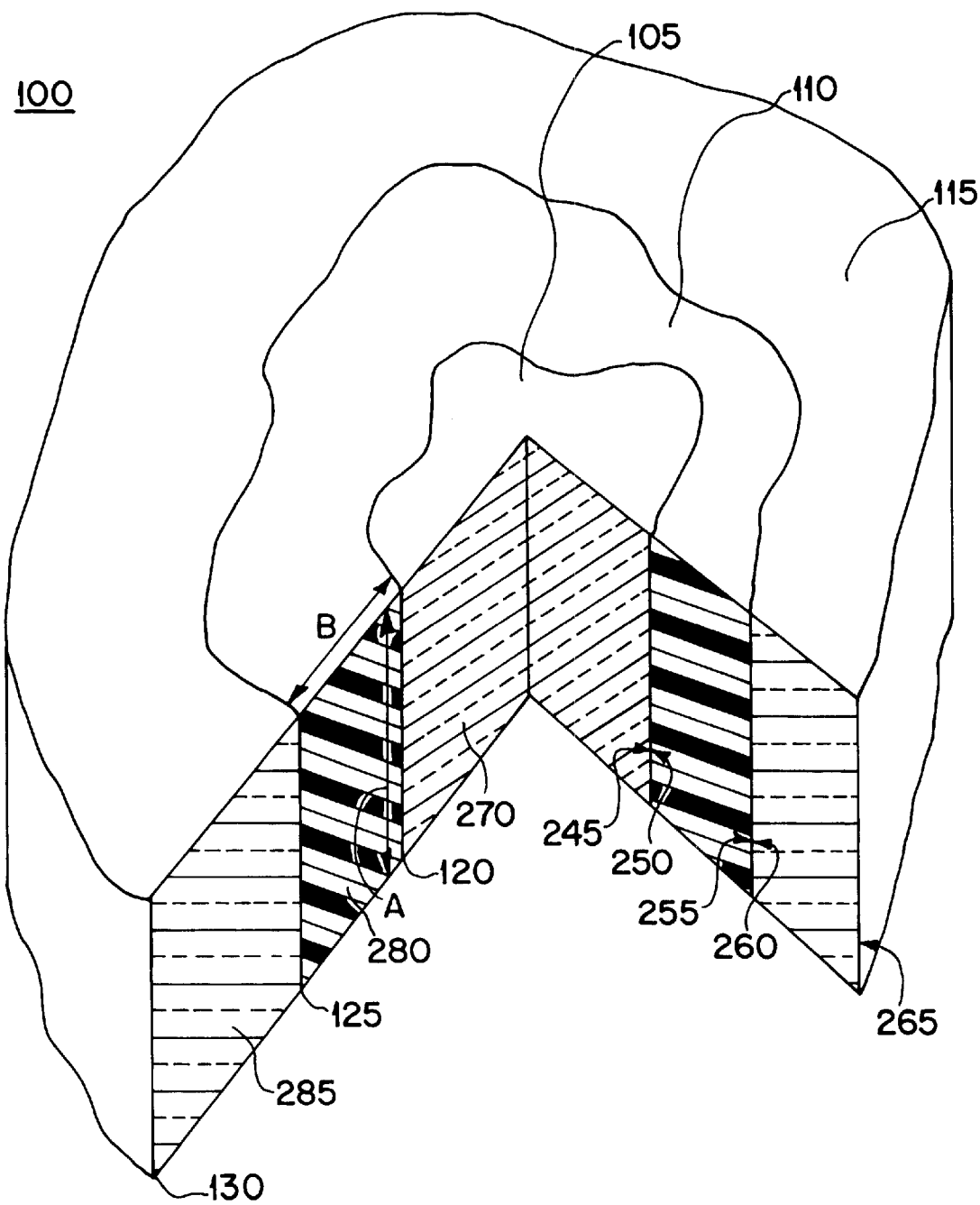
FIG. 2 is a partial cross-sectional view of a compliant mechanism, in accordance with another embodiment of the present invention.
Figure 3A:
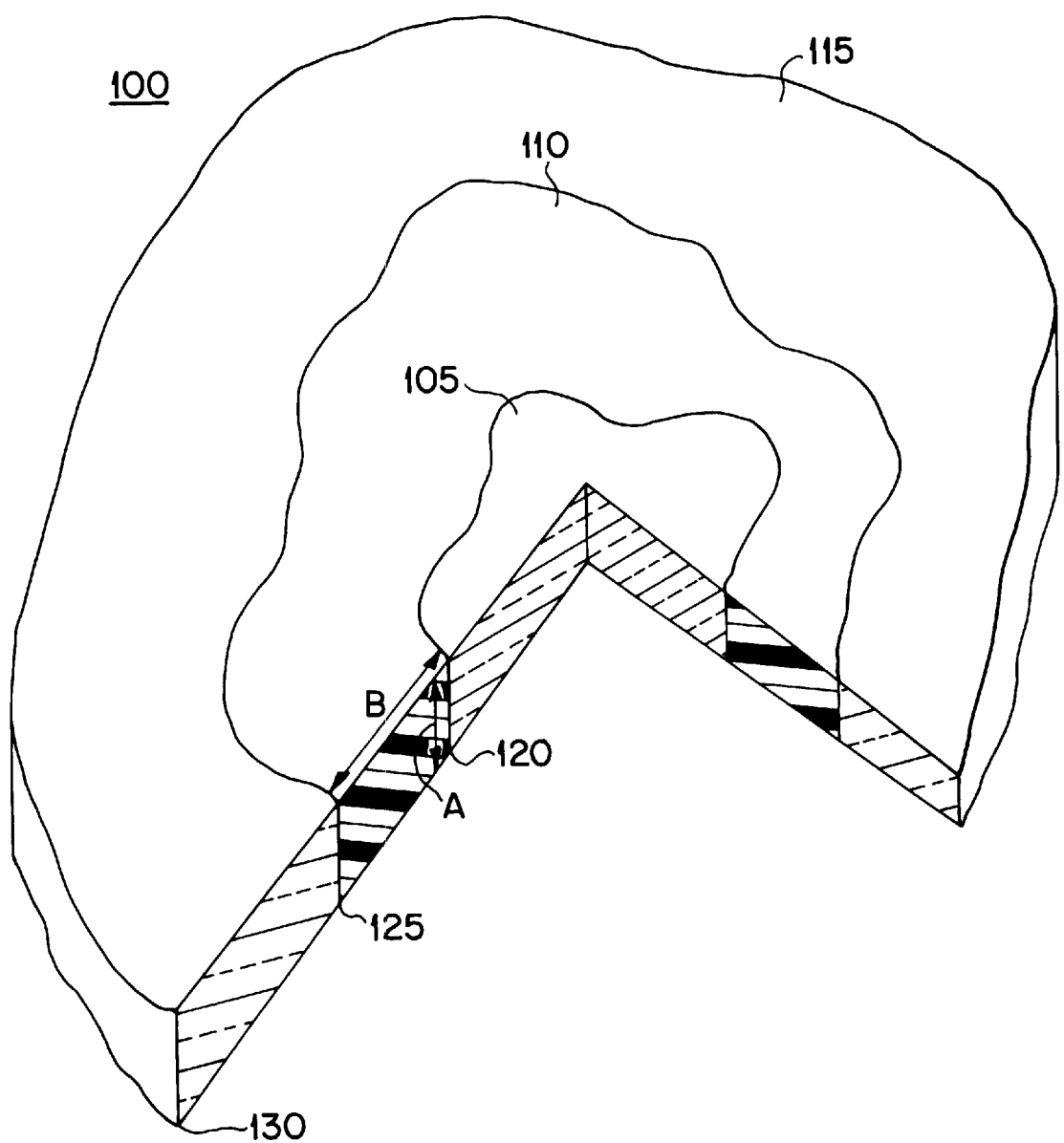
FIG. 3A is a partial cross-sectional view of a compliant mechanism, in accordance with another embodiment of the present invention.

FIGS. 2 and 3A are partial cross-sectional views of the compliant mechanism 100 of an embodiment of the present invention, showing different aspect ratios for the compliant member 110, as will be explained in more detail below. As described above, an embodiment of the compliant mechanism 100 is shown which includes an island 105 attached to a compliant member 110 which is surrounded by and attached to a frame 115. The island 105 and the compliant member 115 meet at a first interface 120. The compliant member 110 and the frame 115 meet at a second interface 125. The compliant member 110 has an outer edge 130, and the island 105 has an island perimeter 245. The island perimeter 245 defines an outer edge of the island 105. The island perimeter 245 can be formed in any number of symmetric or asymmetric shapes while still falling within the scope of the present invention.

Figure 4A:
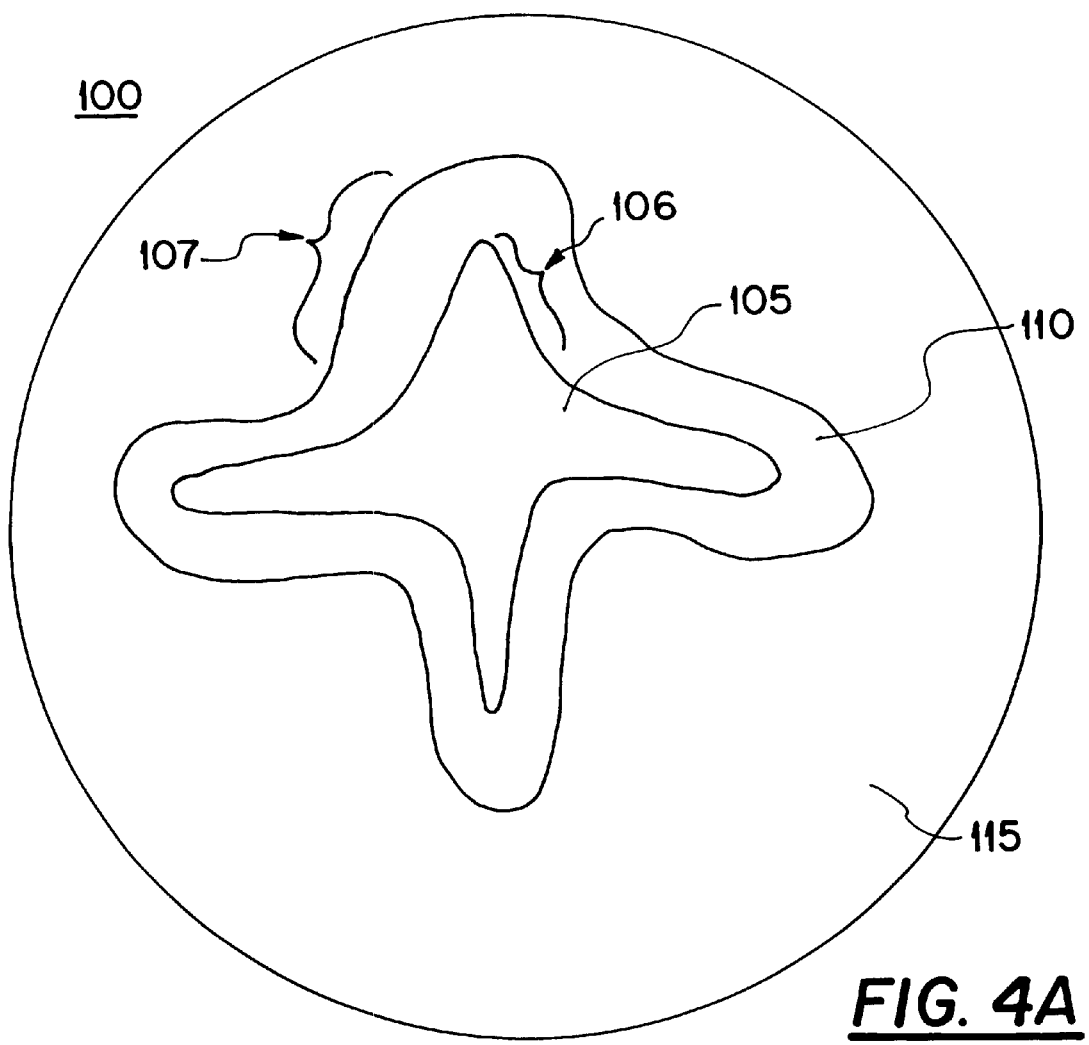
FIG. 4A is a plan view of a compliant mechanism with an island and compliant member having protrusions and indentions, in accordance with another embodiment of the present invention.

FIG. 4A shows one embodiment of the compliant mechanism 110, in which the island 105 has a star-shaped perimeter and the compliant member 110 is configured to closely approximate the star-shaped pattern. The frame 115 is configured to closely approximate the star-shaped pattern as well. Such a star-shaped pattern provides corresponding protrusions 106 and indentions 107 in the island 105 and frame 115 which cooperate to inhibit motion where movement of the protrusion 106 would compress the elastomer. This is particularly true where a protrusion 106 on the island 105 is located within an indention 107 in the frame 115, or vice-versa. The star-shaped configuration of FIG. 4A permits longitudinal motion but inhibits rotation of the island 105 in the plane of the frame 115 relative to the frame.

Figure 4B:
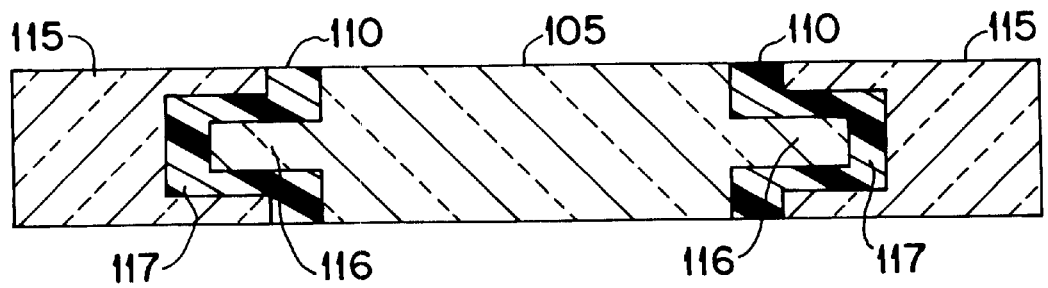
FIG. 4B is a cross-sectional view of a compliant mechanism that allows circular motion of the island, in accordance with another embodiment of the present invention.

Other geometries incorporating protrusions and/or indentions can be used to allow and inhibit other motion. For example, as shown in FIG. 4B, the perimeter of the island 105 could be formed as a protrusion 116 with the inner perimeter of the frame 115 sharing an indention 117 in which the protrusion 116 is positioned. In this embodiment, the compliant material 110 is formed between all sides of the protrusion 116 and the inner perimeter of the frame 115.

This embodiment allows rotational movement, while inhibiting longitudinal movement and movement perpendicular to the plane of the island. It should be appreciated that the protrusions 116 do not necessarily need to extend from the top to the bottom of the elastomer 110.

Referring back to FIGS. 2 and 3A, the compliant member 110 has a compliant member interior perimeter 250. The compliant member interior perimeter 250 is an interior surface of the compliant member 110. The compliant member interior perimeter 250 can be any number of symmetric or asymmetric shapes while still falling within the scope of the present invention. The compliant member 110 includes a compliant member outer perimeter 255. The compliant member outer perimeter 255 defines the outer boundary of the compliant member 110. The compliant member outer perimeter 255 can be any number of symmetric or asymmetric shapes while still falling within the scope of the present invention.

The frame 115 includes a frame outer surface 265. The frame outer surface 265 defines the exterior boundary of the frame 115. The frame outer surface 265 can be any number of symmetric or asymmetric shapes while still falling within the scope of the present invention.

In general, the island 105 is formed of a first material 270, the compliant member 110 is formed of a second material 280 and the frame 115 is formed of a third material 285. The first, second, and third materials may be the same, similar, or different materials or any combination thereof. It should be noted, however, that one preferred embodiment includes forming the island 105 and the frame 115 from a single wafer of etchable material causing the island 105 and the frame 115 to consist of the same material.

Figure 3B:
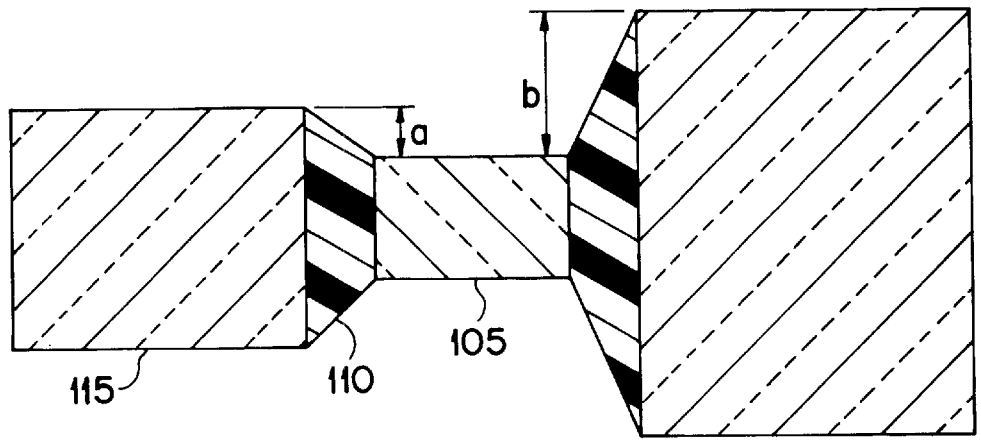
FIGS. 3B, 3C, and 3D are cross-sections of a compliant mechanisms showing various geometries for the components.
Figure 3C:
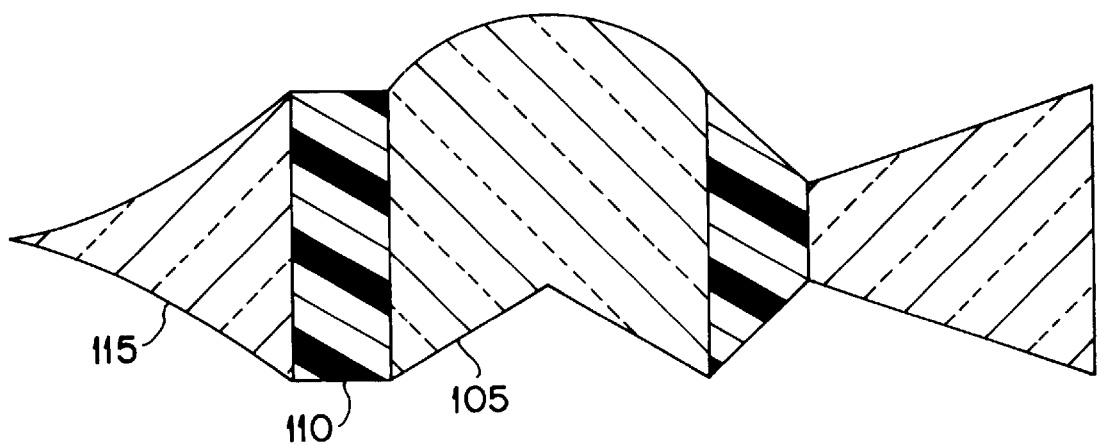
Figure 3D:
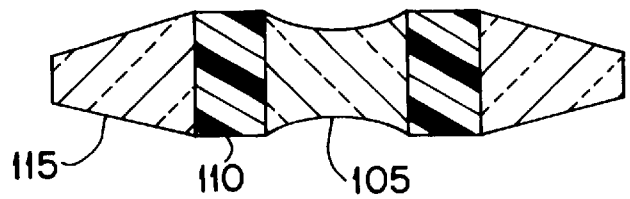

FIGS. 3B, 3C and 3D are cross-sectional views of the compliant mechanism 100 that illustrate examples of various component geometries. In FIG. 3B, the thickness of the island 105 is different than the thickness of the frame 115. In FIG. 3B, the compliant member 110 spans that thickness difference. However, the compliant member also can be thicker or thinner than the island 105 or frame 115 where the compliant member 110 attaches to the island 105 or frame 115. FIG. 3B further shows how the frame 115 can vary in thickness.

As illustrated in FIG. 3B, the top and/or bottom surfaces of the frame 115 in some embodiments may not be level with the top and/or bottom surfaces, respectively, of the island 105, as indicated by the distances labeled a and b. A multitude of geometries are possible for the components of the compliant mechanism 100.

FIG. 3C shows an embodiment of the compliant mechanism 100 where the surfaces of the frame 115 and the island 105 are neither flat, nor parallel with one another. By using various etching techniques know in the art, the surfaces of the island 105 and frame 115 can be made concave or convex, as well as including an indention or a protrusion. Additionally, as shown in FIG. 3C a single component such as the frame 115 can have non-parallel surfaces. FIG. 3D shows another example of possible frame 115, compliant member 110, and island 105 geometries for the compliant mechanism.

In the example of FIG. 3D, the frame 115 has a non-parallel upper and lower surface which generally define a wedge-shape in the cross-sectional view. Furthermore, the island 105 has had its upper and lower surfaces etched in a manner to produce concave surfaces. Also, the height of the island 105, compliant member 110 and frame 115, although shown in the preferred embodiment to have equal heights, can be implemented with unequal heights. Additionally, the top, bottom and other surfaces of the island 105, compliant member 110 and frame 115 could be made to have other than flat, parallel surfaces. Desired surfaces could include for example a wedge-or a lens-shape. In FIGS. 3B, 3C, and 3D, the compliant member 110 accommodates the differences in geometries between the frame 115 and the island member 105, and can be made to generally span or conform to any type of irregular or regular geometry.

An important characteristic of the compliant member 110 is its aspect ratio. As illustrated in FIG. 3A, the aspect ratio of the compliant member 110 is the height "A" of the compliant member 110 divided by the width "B" of the compliant member 110. Depending on the compliant member's aspect ratio, the compliant member 110 will exhibit certain mechanical characteristics, such as flexing primarily in shear or tension. By altering the aspect ratio, certain types of motion of the island 105 can be suppressed or mitigated, and other types of motion of the island 105 can be enhanced or selected. The compliant mechanism 100 shown in FIG. 2 has a compliant member 110 with an aspect ratio greater than one. The compliant mechanism 100 shown in FIG. 3A has a complaint member 110 with an aspect ratio less than one. The aspect ratio of the compliant member 110 also need not be uniform around the perimeter and selected aspect ratios can be used to enhance or inhibit selected motion of the island.

In FIG. 2, the cross-section of the compliant mechanism 100 shows the compliant member inner perimeter 250 and compliant member outer perimeter 255 as being substantially parallel. However, it should be appreciated that these two surfaces may have any geometrical relationship with respect to one another. Thus, the compliant member inner perimeter 250 and compliant member outer perimeter 255 need not be parallel, but can also be non-parallel and any irregular or symmetric or asymmetric shape while still falling within the scope of the present invention. Non-parallel perimeters can be used to design actuation mechanisms that enhance or suppress selected motions of the island.

The island 105 has what is generally referred to as a "neutral position" which is the position the island 105 tends towards when not subjected to external forces. Thus, the island 105 tends to remain in a neutral position until an external force is applied to the island 105 which displaces the island 105 from the neutral position.

Figure 5:
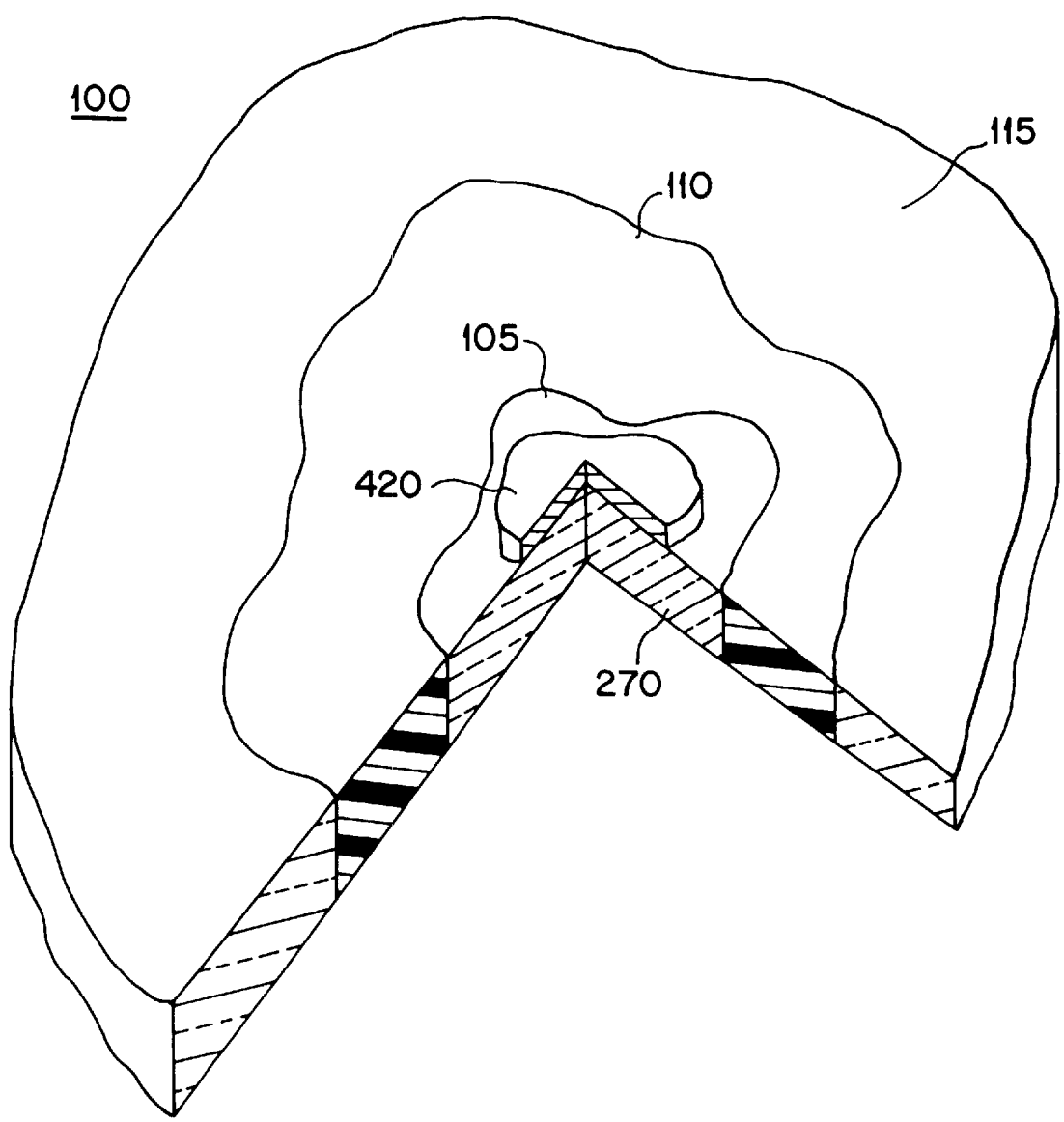
FIG. 5 is a partial cross-sectional view of a tunable optical device, in accordance with an embodiment of the present invention.

FIG. 5 illustrates how an optical component 420 may be supported by the island 105 of the compliant mechanism 100. The optical component 420 can include any variety of optical components or elements such as a fully reflective mirror, a partially reflective mirror, a hologram, a diffraction grating, a lens, prism, filter, various waveplates, etc. Note that other components requiring precise positioning can also be placed on the island 105 in substitution for, or in addition to the optical component 420.

The components of the compliant mechanism can be formed from a variety of materials. As described above, the island 105 is formed of a first material 270, which can be opaque, translucent, or transparent to electromagnetic radiation. The first material 270 may also be an electrical conductor or an electrical insulator. Furthermore, the first material 270 may be rigid or flexible. The optical component 420 may be intrinsic with the island 105 or affixed to the island 105 by any of various means well known in the art such as bonding by various adhesives, or metallic bonding such as soldering, etc. The optical component 420 may also be formed using standard silicon or glass fabrication/processing techniques. In other embodiments of the invention, the optical component 420 may be attached to the island 105 indirectly or may be attached to more than one island. For example, in one embodiment, which will be described in more detail below in connection with FIG. 9B, the optical component 420 can be mounted on three pins, like a three-legged "table", in which each of the pins are attached to or forms the island. The displacement or orientation of each pin then can be controlled individually. The optical component 420 also could be attached off-center, or otherwise asymmetrically, and could be attached in different angular and longitudinal positions relative to the island 105 and/or frame 115.

Figure 6:
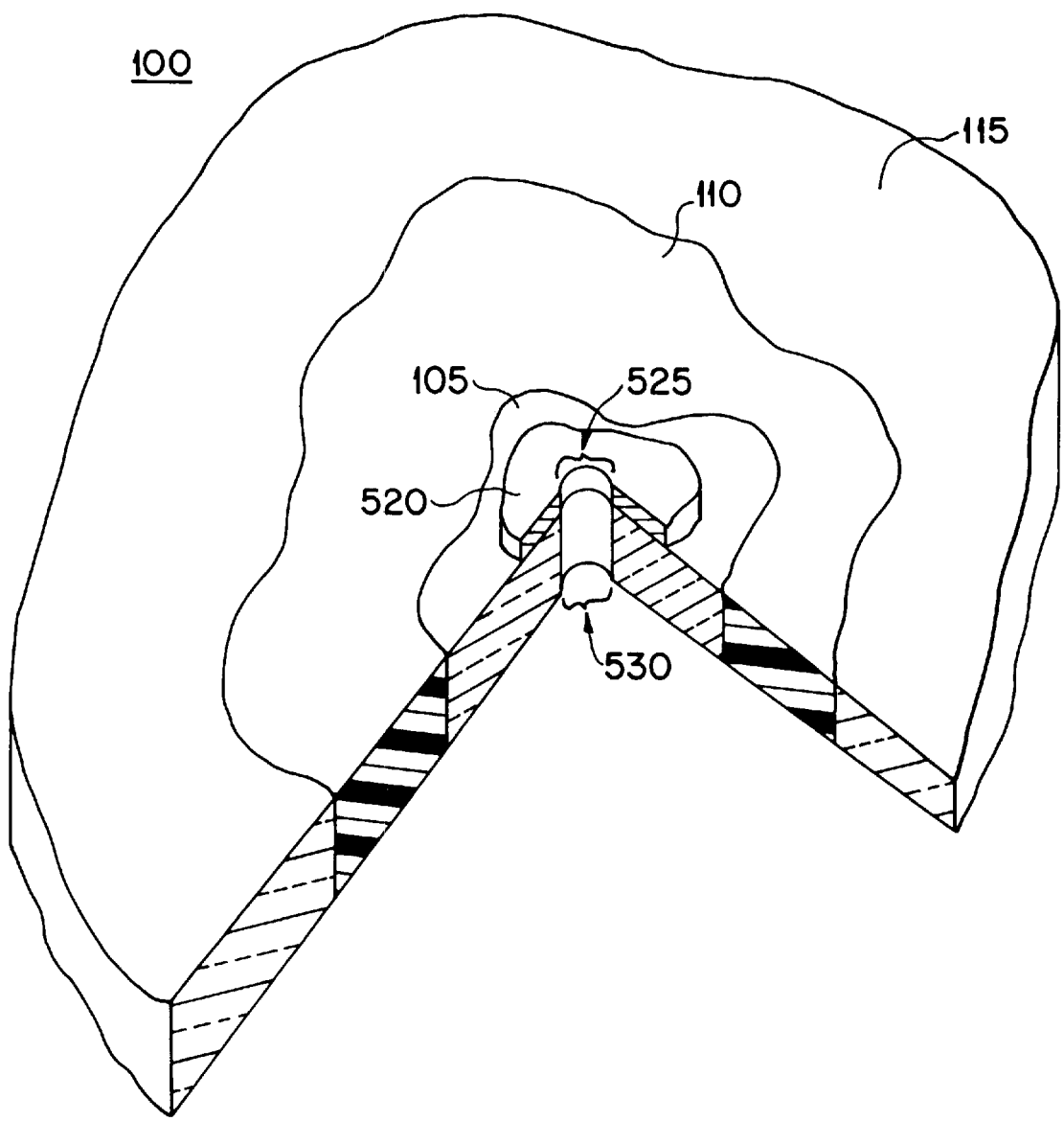
FIG. 6 is a partial cross-sectional view of a tunable optical device, in accordance with another embodiment of the present invention.

As shown in FIG. 6, an optical component 520 with an optical component aperture 525 that extends through the optical component 520 may be used. Similarly, an island aperture 530 may extend through the island 105. Although the optical component aperture 525 and the island aperture 530 are both shown as substantially circular in shape, it should be appreciated that any shape, symmetric or asymmetric, may be used. Typically, when an optical component 520 having an optical component aperture 525 is affixed to the island 105, the optical component aperture 525 will be configured to substantially "line-up" with the island aperture 530. Alternatively, in lieu of an aperture, the island 105 may be formed from a material that is transparent to the wavelength of the light that will be impinging on the island 105 to allow light to pass through the island as desired.

Figure 7:
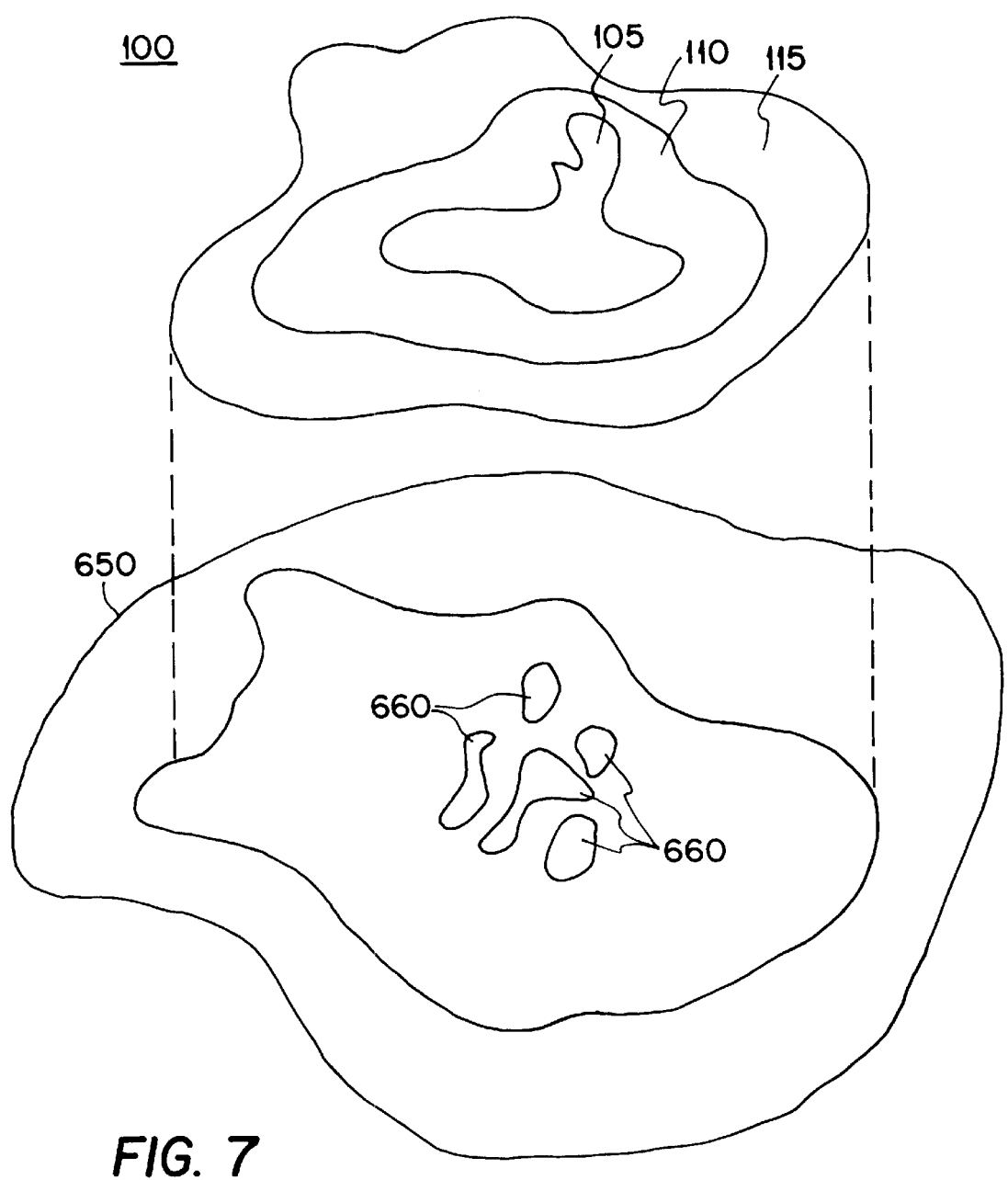
FIG. 7 is a schematic representation of an actuated mechanism, in accordance with an embodiment of the present invention.

FIG. 7 shows a schematic representation of an actuated device, in which actuators 660 are used to move the island 105 of the compliant mechanism 100. The actuators 660 are disposed on an actuator support 650. The actuators 660 are disposed on the actuator support 650 in a region where they are able to communicate with the island 105 of the compliant mechanism 100 through magnetic force (e.g., through the interaction of a pair of magnets); an electrostatic force (e.g., the attraction or repulsion of charges on a pair of conductive plates); or a mechanical force (e.g., through physical contact by a piezoelectric material).

Although multiple actuators 660 are shown, it should be appreciated that more actuators or fewer actuators than shown, such as, only one actuator can be used. Further, the actuator or actuators can have any desired shape and be located anywhere on the actuator frame 650.

Figure 8:
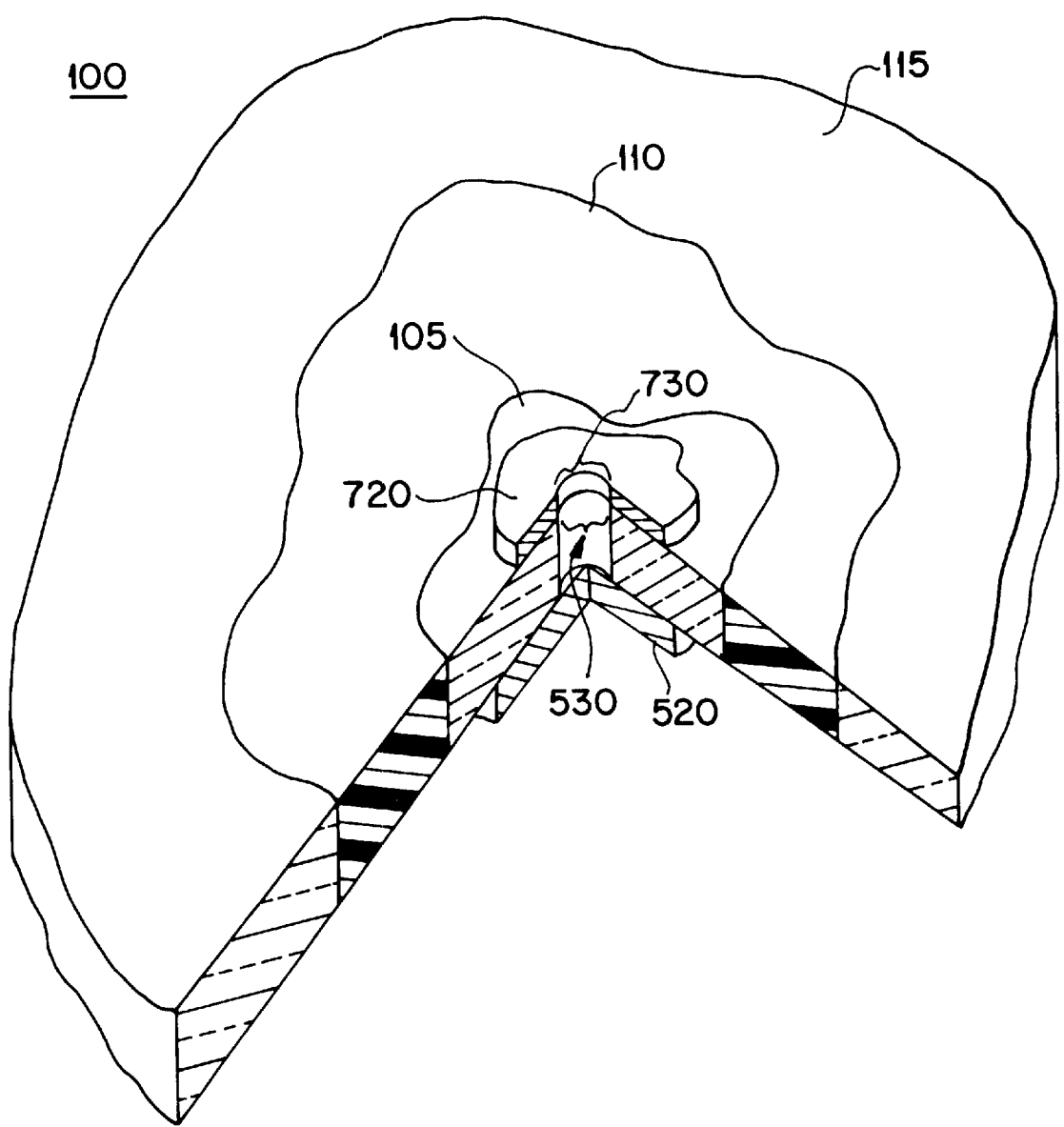
FIG. 8 is a partial cross-sectional view illustrating how an island actuator may be attached to a compliant mechanism, in accordance with an embodiment of the present invention.

Depending on the type of actuators 660 used on the actuator support 650, it may be necessary to position one or more island actuators on the compliant mechanism 100 to interact with the actuators 660. As shown in FIG. 8, such an island actuator 720 may be affixed to the island 105 of the compliant mechanism 100 on a side of the island 105 opposite the optical component 520. In the embodiment shown, the island 105 includes an island aperture 530, the island actuator 720 includes an actuator aperture 730, and the island actuator 720 is disposed on the island 105 such that the actuator aperture 730 substantially lines-up with the island aperture 530.

Figure 9A:
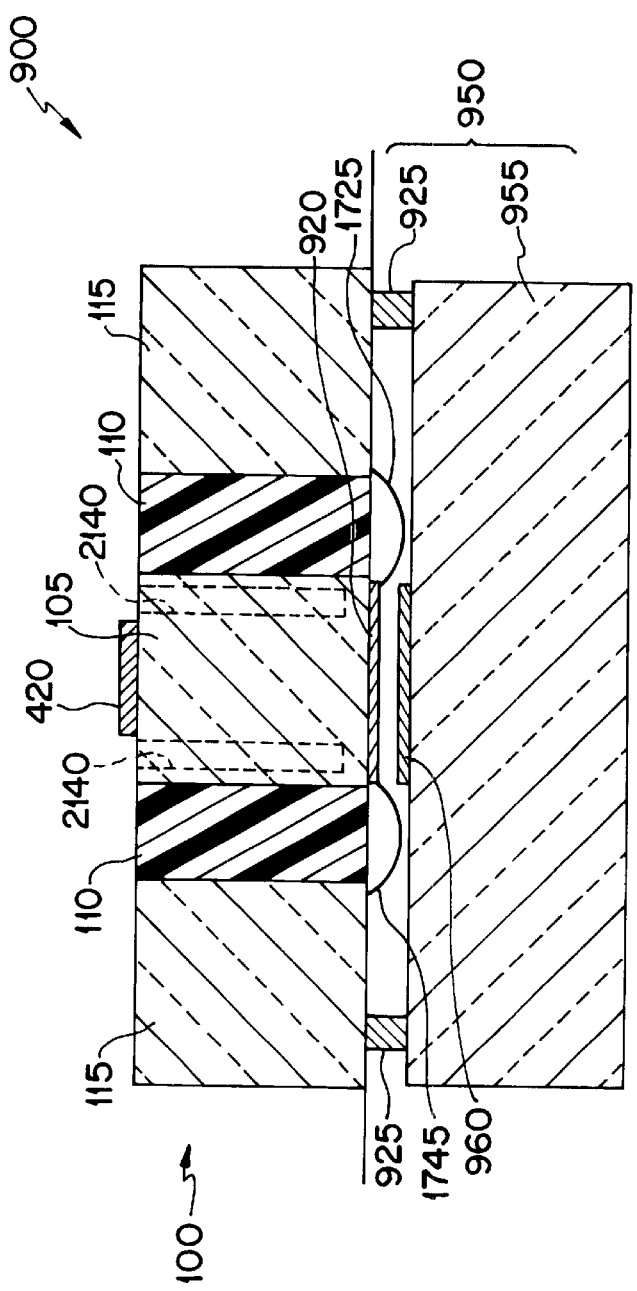
FIG. 9A is a cross-sectional view of an actuated mechanism, in accordance with another embodiment of the present invention.

FIG. 9A is a cross-sectional view of an actuated device 900, in accordance with one embodiment of the present invention. The actuated device 900 includes a compliant mechanism 100, which is disposed adjacent to an actuator support 950. The compliant mechanism 100 includes an island 105, which is surrounded by and attached to a compliant member 110. The compliant member 110 is surrounded by and attached to a frame 115. Attached to the island 105 is a first actuator 920. The first actuator 920 can include any number and configuration of magnetic, electrostatic, or mechanical force transducers, but are preferably electrodes configured for electrostatic actuation.

In the embodiment shown, an optical component 420 is supported by the island 105. The optical component 420 can be a mirror, grating, or any other type of optical component. For example, the optical component 420 can be a dielectric stack mirror deposited onto the top surface of the island 105. The optical component 420 further can be formed intrinsically with the island 105.

The actuator support 950 includes an actuator frame 955 onto which is attached a second actuator 960. The second actuator 960 can include any configuration of force transducers which cooperatively function with the first actuator 920, but are preferably electrodes for electrostatic actuation. The compliant mechanism 100 is attached to the actuator support 950 by spacers 925. The spacers 925 serve to maintain a predetermined spacing between the second actuator 760 and the first actuator 720 when the actuators are not actuated.

In operation, the first and second actuators 920 and 960 can be controlled to apply a force to the island 105, thereby moving the island 105. The compliant member 110 exerts a restoring force to the island 105, which tends to urge the island 105 back into alignment with the frame 115 when the actuating force is removed.

In a preferred embodiment, the first and second actuators 920 and 960 comprise electrodes that are configured to generate an electrostatic force when a command signal is applied to the first and second actuators 920 and 960. The command signal applied to the first and second actuators 920 and 960 can be configured to create a repulsive or an attractive electrostatic force between the first and second actuators 920 and 960.

Electrical connections to the first actuator 920 are accomplished with leads 1725 and 1745. Depending on the material used for the compliant member 110, the compliant member 110 may expand and contract with changes in the ambient temperature. In one preferred embodiment, the leads 1725 and 1745 are spaced apart from the compliant member 110 by an amount that will allow the compliant member 110 to expand without breaking the leads 1725 and 1745. Alternatively, leads 1725 and 1745 may be configured so that they physically contact and traverse complaint member 110 in a pattern that will allow the leads 1725 and 1745 to expand and contract with the complaint member 110 without breaking.

A feature of the present invention is that the actuation mechanism, comprised of the first and second actuators 920 and 960 in the embodiment of FIG. 9A, is on a side of the compliant mechanism 100 opposite the optical component 420. This effectively separates the "drive cavity", which is the area between the compliant mechanism 100 and the actuator support 950, from any optical cavity that may be formed with the optical component 420. For example, the optical component 420 may be a mirror, and a second mirror may be positioned in a parallel relationship with optical component 420 to form a resonant optical cavity. The design of the actuated device 900 allows for independent optimization of the actuation mechanism and/or the optical cavity.

Figure 9B:
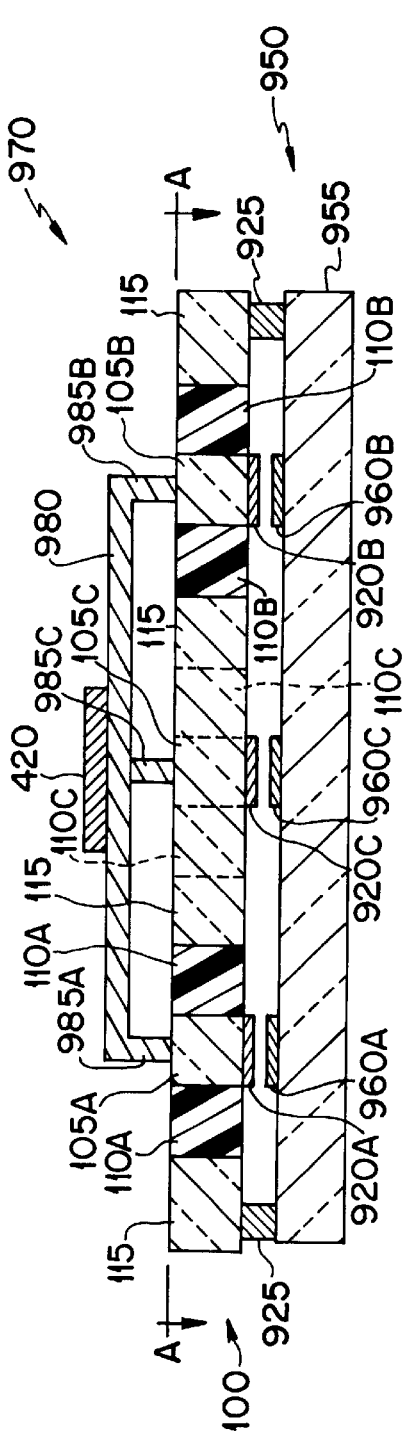
FIG. 9B is a cross-sectional view of an actuated mechanism, in accordance with another embodiment of the present invention.
Figure 9C:
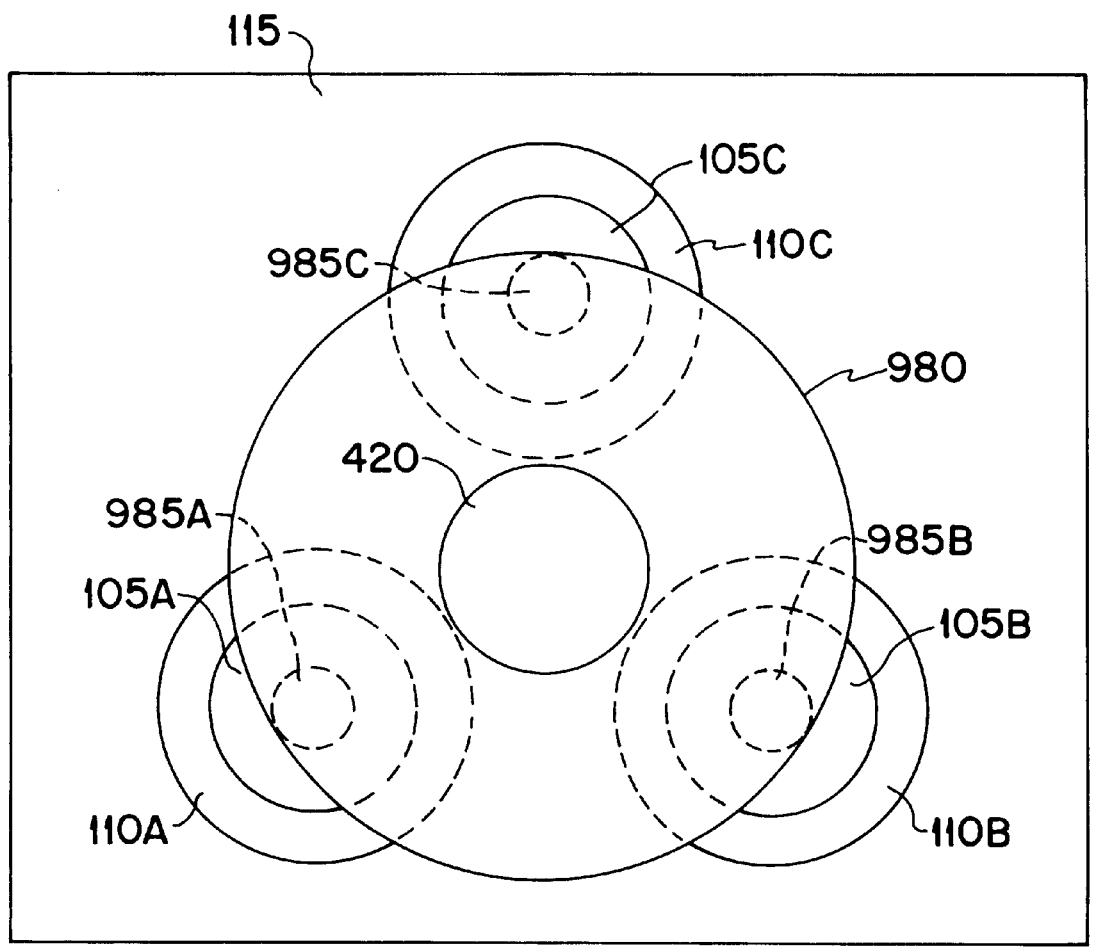
FIG. 9C is a top plan view of the actuated mechanism of FIG. 9B.

FIGS. 9B and 9C show an actuated device 970, in accordance with another embodiment of the present invention. The actuated device 970 includes a compliant mechanism 100, which includes a first island 105A, a second island 105B, a third island 105C a frame 115, and compliant members 110A, 110B and 110C that are each surrounded by and attached to the frame 115. First actuators 920A, 920B and 920C are attached to islands 105A, 105B and 105C, respectively.

The actuator support 950 includes an actuator frame 955, onto which is attached second actuators 960A, 960B and 960C. The first actuators 920A, 920B and 920C, and the second actuators 960A, 960B and 960C can include any number and configuration of magnetic, electrostatic, or mechanical force transducers that cooperatively function to move the islands 105A, 105B and 105C. In a preferred embodiment, first actuators 920A, 920B and 920C, and second actuators 960A, 960B and 960C are preferably electrodes configured for electrostatic actuation.

Support columns 985A, 985B and 985C of an optical support 980 are attached to islands 105A, 105B and 105C, respectively. In the embodiment shown, an optical component 420 is support by the optical support 980. The compliant mechanism 100 is preferably attached to the actuator support 950 by spacers 925.

Figure 10:
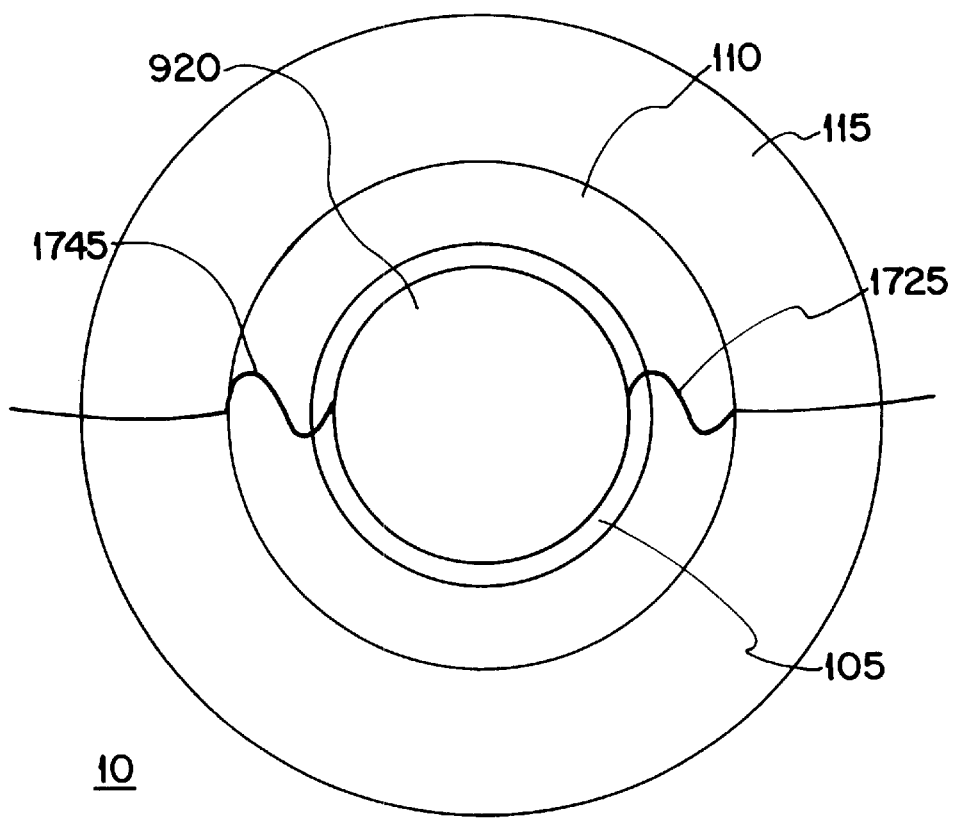
FIG. 10 is a plan view of the actuated mechanism of FIG. 9, illustrating one type of electrode pattern that may be used to traverse the compliant member shown in FIG. 9.

One example of a lead pattern that can be used in the actuated device of the present invention is shown in FIG. 10, which is plan view of the compliant mechanism 100 shown in FIG. 9A. As shown in FIG. 10, the leads 1725 and 1745 are patterned in an "S" pattern as they traverse the compliant member 110. Such leads can be referred to as "S-leads". In this way, if the compliant member 110 expands or contracts, the "S" portion of the leads 1725 and 1745 will tend to straighten without breaking. Although an "S" shape is shown as one example of a type of lead pattern that can be used to traverse the compliant member 110, it should be appreciated that any shape that will help mitigate the effects of expansion and contraction of the compliant member 110 may be used while still falling within the scope of the present invention. Furthermore, it should be understood that each electrode lead 1725 and 1745 may include multiple conductors.

Referring back to FIGS. 9A–9c, the islands 105, 105A, 105B and 105C represent a suspended mass, and the compliant members 110, 110A, 110B and 110C represent a spring supporting the mass represented by the islands 105, 105A, 105B and 105C. Thus, the island and compliant member combination is a mechanically resonant structure.

The mass of the island and/or the spring constant of the compliant member can be adjusted to obtain a predetermined resonant frequency. This can be useful if, for example, one wants to avoid movement of the island when the entire actuated device is physically moved at relatively low frequencies.

One way to adjust the resonant frequency of the island and compliant member combination is to adjust the mass of the island. However, there may be a limit as to how small the island can be made because of the physical size of the optical component 420 that is supported by the island. As shown in FIG. 9A, one way of removing mass from the island 105 is to create voids 2140 in the island 105 by etching trenches or wells in the island 105. The voids 2140 may be created by any means known in the art.

As discussed above, one of the preferred actuation methods is electrostatics. This is accomplished by making the first actuator 920 on the compliant optical support 100 and the second actuator 960 on the actuator frame 955 electrodes that are configured to receive command signals that, in turn, generate attractive electrostatic forces between the actuators 920 and 960.

The actuator structures shown in FIGS. 9A–9C are configured to move the island 105 up and down with little or no tilt. However, it should be appreciated that other patterns can be used for the first and second actuators 920 and 960 in order to obtain or control additional degrees of motion.

Figure 11A:
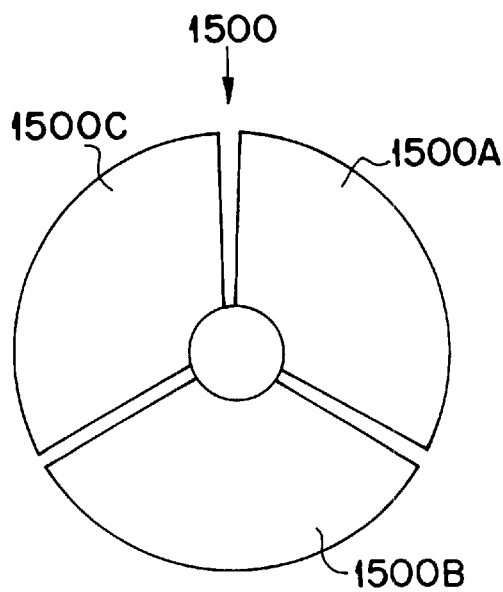
FIGS. 11A and 11B are plan views of one possible actuator pattern that can be used in the actuated mechanism of FIG. 9.
Figure 11B:
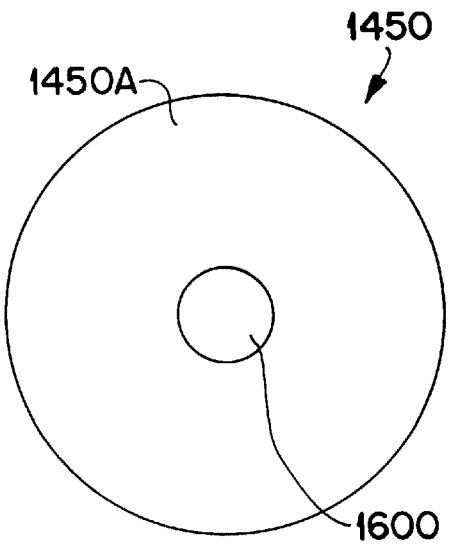

For example, FIGS. 11A and 11B are plan views of a preferred embodiment of first and second sets of electrodes 1500 and 1450, respectively configured to reduce tilt. The first and second set of electrodes 1500 and 1450 correspond to the first and second actuators 920 and 960, respectively, in FIG. 9. In this embodiment, three electrodes 1500A–1500C make up the first set of electrodes 1500, and a single common electrode 1450A is used for the second set of electrodes 1450. It should be appreciated that this arrangement could be reversed, so that the three electrodes 1500A–1500C could be placed on the actuator frame 955, while the common electrode 1450A is placed on the island 105.

A particularly advantageous feature of certain preferred embodiments is to have three separately controlled actuator elements in the apparatus, each of which can be used to apply an independent force to a portion of the island. As shown in FIG. 11A, an optimal configuration is to employ three electrodes on a rigid island. The voltage applied to each independent electrode generates an independent force, generally perpendicular to the surface of the island, centered at the geometric mid-point of the electrode segment. Each electrode segment has a distinct center of force. The electrode segments can be arranged such that these three centers of force are distributed advantageously across the surface of the island, enabling the actuators to actuate the island to move into any desired position. The use of three centers of force provides for accurate, deterministic positioning for systems with three degrees of freedom such as pitch and yaw angles and z-axis displacement of the device previously described (FIG. ???) It should be recognized that the three centers of force can be generated using a number of electrodes patterns. For example, there can be three electrodes on the actuator support member and a common electrode on the island, which would result in three centers of force on the island corresponding to the three electrodes. There are numerous other ways to generate three centers of force on the island.

As discussed above, first and second sets of electrodes 1500 and 1450 are configured to generate an electrostatic force when a command signal (voltage) is applied thereto. The command signal can be configured to create a repulsive or an attractive electrostatic force between the electrodes 1500 and 1450. However an attractive electrostatic force is the preferred mode of operation.

During displacement, up and down motion of the island 105, and therefore the spacing of the gap between the first and second actuators, 920 and 960, can be controlled by applying a voltage between the three electrodes 1500A–1500C and the counter-electrode 1450A. The three-electrode structure shown in FIG. 11A for the first set of electrodes 1500 allows for control of the tilt of the island 105, and therefore the optical component 420 mounted thereto, with respect to the frame 115. This is accomplished by selectively applying a stronger voltage to one or more of the three electrodes 1500A–1500C. Although, in this embodiment, three electrodes are used for the first set of electrodes 1500, a different electrode pattern and a different number of electrodes can be used while still falling within the scope of the present invention.

In order to control tilt and gap spacing of the island 105, it is preferable to have a sensing mechanism that will indicate how much tilt and gap spacing is present. In one embodiment, the tilt and gap spacing is determined using optical feedback.

Multiple actuated devices 900 may be fabricated together to form an actuated mechanism assembly 2200, as shown in FIG. 12. The actuated mechanism assembly 2200 includes an array of compliant mechanisms 100 mounted adjacent to a corresponding array of actuator supports 955. The actuator supports 955 and their respective compliant mechanisms 100 are each individually controlled, thus each actuated device 900 may function independently or cooperatively with the others. FIG. 12 shows one of the compliant mechanisms 100 actuated in a manner to purposefully tilt the island and the optical component attached thereto relative to the frame.

FIG. 13A is a cross-sectional view of an electrostatically-actuated mirror 2300, in accordance with one embodiment of the present invention. The actuated mirror 2300 can be used as a stand alone actuatable mirror or as a component to an array of actuatable mirrors. However, the actuated mirror 2300 is particularly suitable for use as one of the mirrors in a tunable Fabry-Perot optical cavity.

The actuated mirror 2300 includes a compliant mirror support 2305 disposed adjacent to an actuator support 2350. The compliant mirror support 2305 includes an island 2310, which is surrounded by and attached to a compliant member 2315. The compliant member 2315 is surrounded by and attached to a frame 2320.

The island 2310 supports a mirror 2345, preferably with a high reflectivity coating. Also attached to the island 2310 is an island electrode 2340. This embodiment shows the mirror 2345 and the island electrode 2340 attached on opposite sides of the island 2310. However, it should be understood that the mirror 2345 and the island electrode 2340 may both be attached to the same side of the island 2310 or could have their positions reversed from that shown in the FIG. 13A.

The actuator support 2350 includes an actuator frame 2355 onto which is attached at least one stationary electrode 2360. If the mirror 2345 is to be used as one of the mirrors in a Fabry-Perot cavity, or in any other application which would require that light impinge on the mirror 2345 from the actuator support side, then the actuator support 2350 also preferably includes an actuator support aperture 2380 which is an aperture or hole for light to pass through. Alternatively, the actuator frame 2350 may be formed from a material that is transparent to the wavelength of the light that will be impinging on the actuator frame 2350 to allow light to pass through the actuator frame 2350.

In the case where light is to impinge on the mirror 2345 from the actuator support site, an anti-reflection coating 2346 is preferably placed on the island 2310 opposite the mirror 2345 to reduce reflection losses.

Electrically conductive spacers 2325, preferably solder bumps, are used to provide an electrical connection between leads 2330 and 2365, and are also used to fix the distance between the island electrode 2340 and the stationary electrodes 2360 when the island 2310 is in a neutral position with no force acting between the electrodes.

An actuator frame recess 2370 is preferably created in the actuator frame 2355. The actuator frame recess 2370 is located on the actuator frame 2355 proximate to the compliant member 2315 of the compliant optical support 2305. The actuator frame recess 2370 provides a region where the compliant member 2315 may expand if it swells. The actuator frame recess 2370 also provides a space for the island 2310 to tilt thereby increasing the range of deflection of the island 2310. A person of ordinary skill in the art understands that the closer that the stationary actuators 2360 are to the island actuator 2340, the stronger the actuating force between the two actuators is for a given signal. Thus, by reducing the height of the spacers 2325, the response of the island 2310 to a displacing or tilting signal is increased.

Figure 13B:
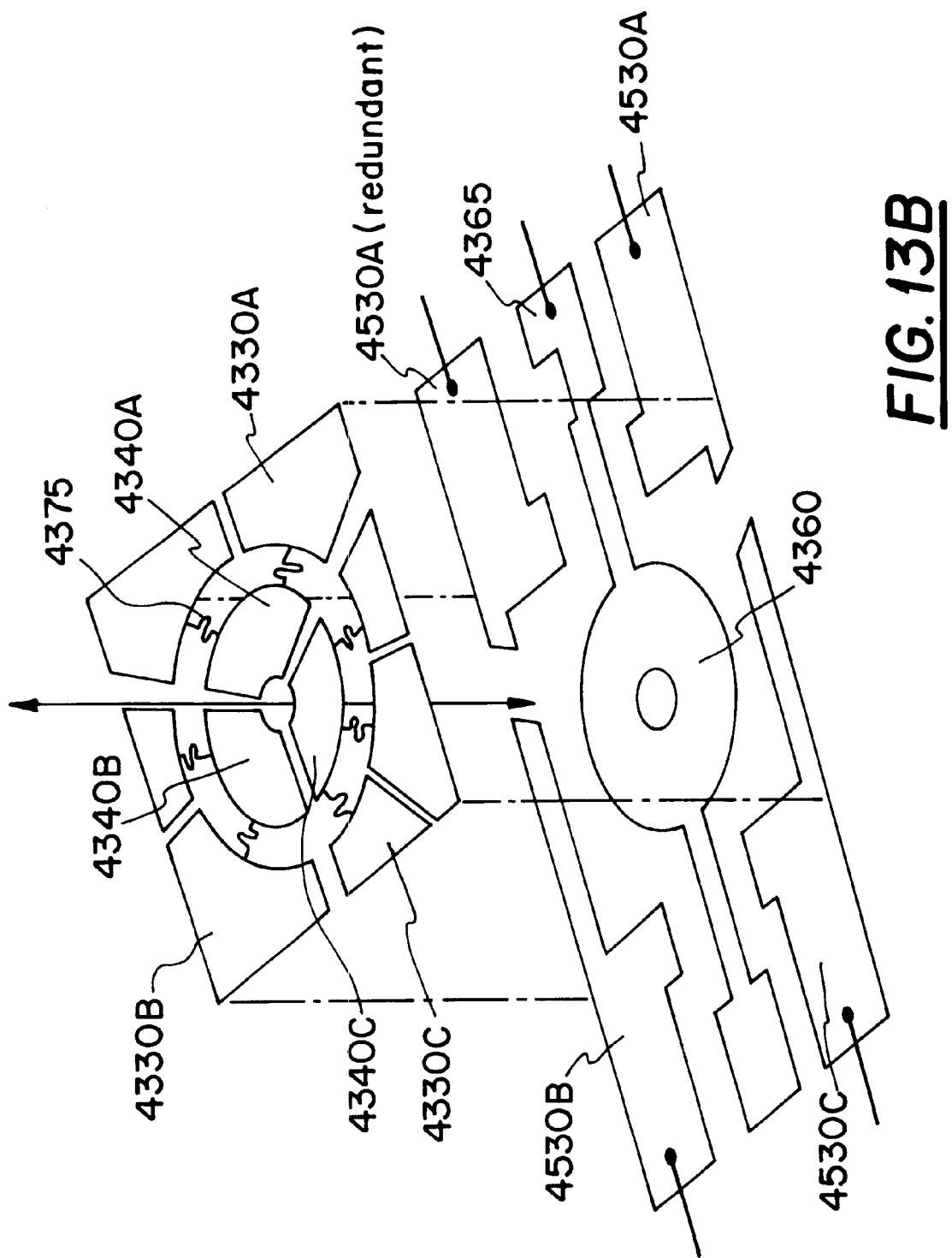
FIG. 13B is a plan view of an embodiment of an electrode arrangement which may be used with the electrostatically-actuated mirror of FIG. 13A.

FIG. 13B shows an example of an electrode arrangement which maybe used for the electrostatically-actuated mirror 2300 illustrated in FIG. 13A. Referring to both FIGS. 13A and 13B, the electrical connections on the compliant mechanism 4305 include island electrodes 4340A, 4340B, and 4340C, which are attached to the island 4310. "S" leads 4375 connect the island electrodes 4340A, 4340B, and 4340C to electrode leads 4330A, 4330B, 4330C, on the frame 4320, respectively.

The "S" leads 4375 are flexible folded metal leads which span the compliant member 4315 to electrically couple each respective lead of the compliant optical support 4305. Although "S" leads are shown, any flexible conductor arrangement suitable to form a flexible electrical connection between electrodes on the island 4310 and electrodes on the frame 4320 may be used while still falling within the scope of the invention. Variations in flexible conductor design may include alternative mechanically flexible geometries, as well as flexibly conductive materials. Additionally, the number of "S" leads 4375 can vary from one, to the nine shown in FIG. 13B, to any number which adequately couples the electrodes on the island 4310 to electrical circuits external to the electrostatically-actuated mirror 2300.

The electrode design on the actuator support 4350 includes island electrode connections 4530A, 4530B, and 4350C. The actuator support 4350 also includes stationary electrode 4360, and stationary electrode lead 4365. The island electrode connections 4530A, 4530B, and 4350C are preferably arranged to form an electrical connection between the actuator support 2350 and the compliant optical support 4305, when the two components are assembled.

The island electrodes 4340A–4340C, and stationary electrode 4360, togther allow for control of the tilt of the island 105, in a manner similar to the electrode structure of FIGS. 11A and 11B.

It should be noted that the examples of electrode arrangement shown in FIGS. 13A and 13B is not exhaustive of possible electrode designs. Any electrode design which allows sufficient movement of the island 4305 while still providing adequate electrical coupling to control, measurement, and driving electronics may be used while still falling within the scope of the invention.

Figure 13C:
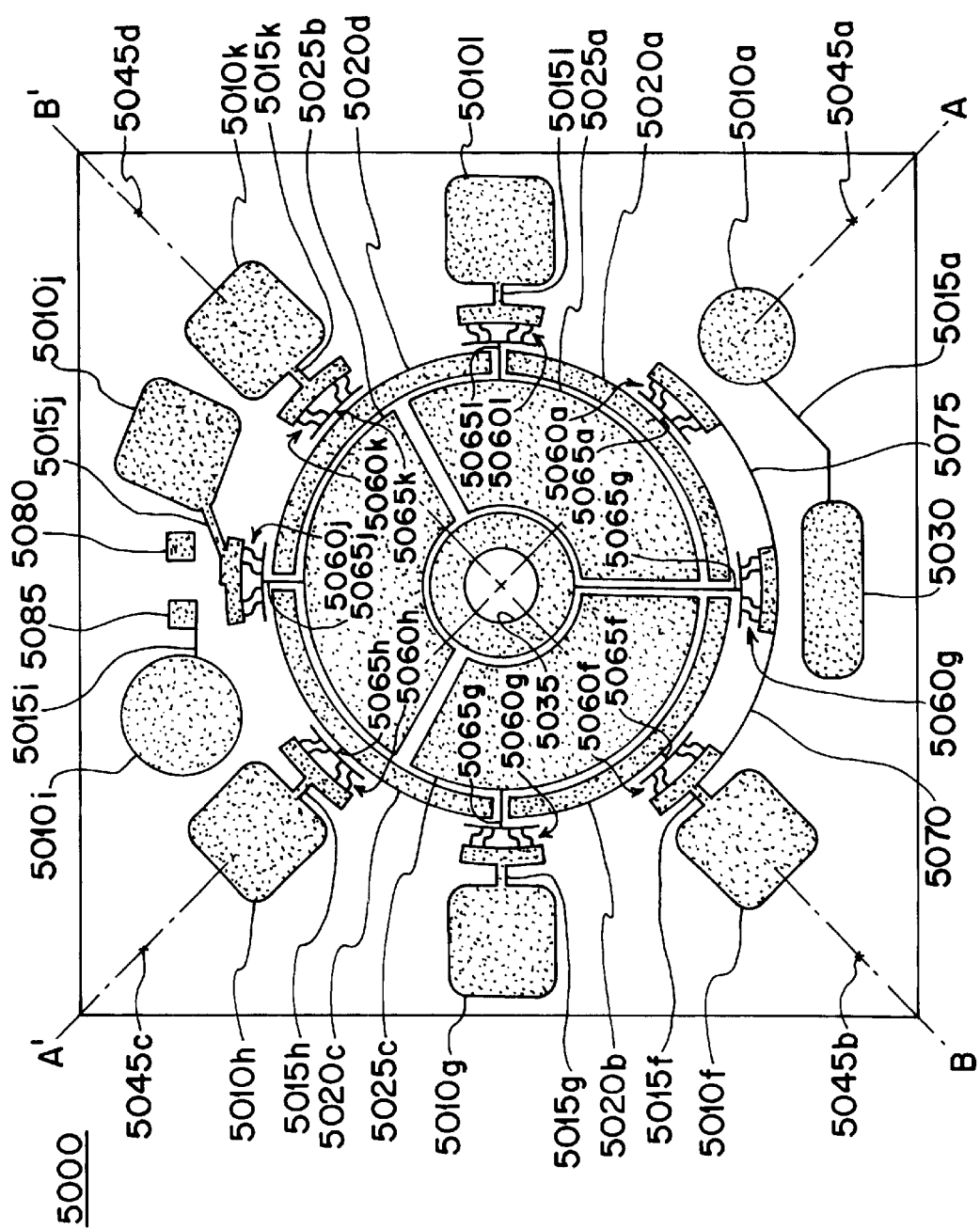
FIGS. 13C and 13D are plan views of electrode geometries for the compliant mechanism.
Figure 13D:
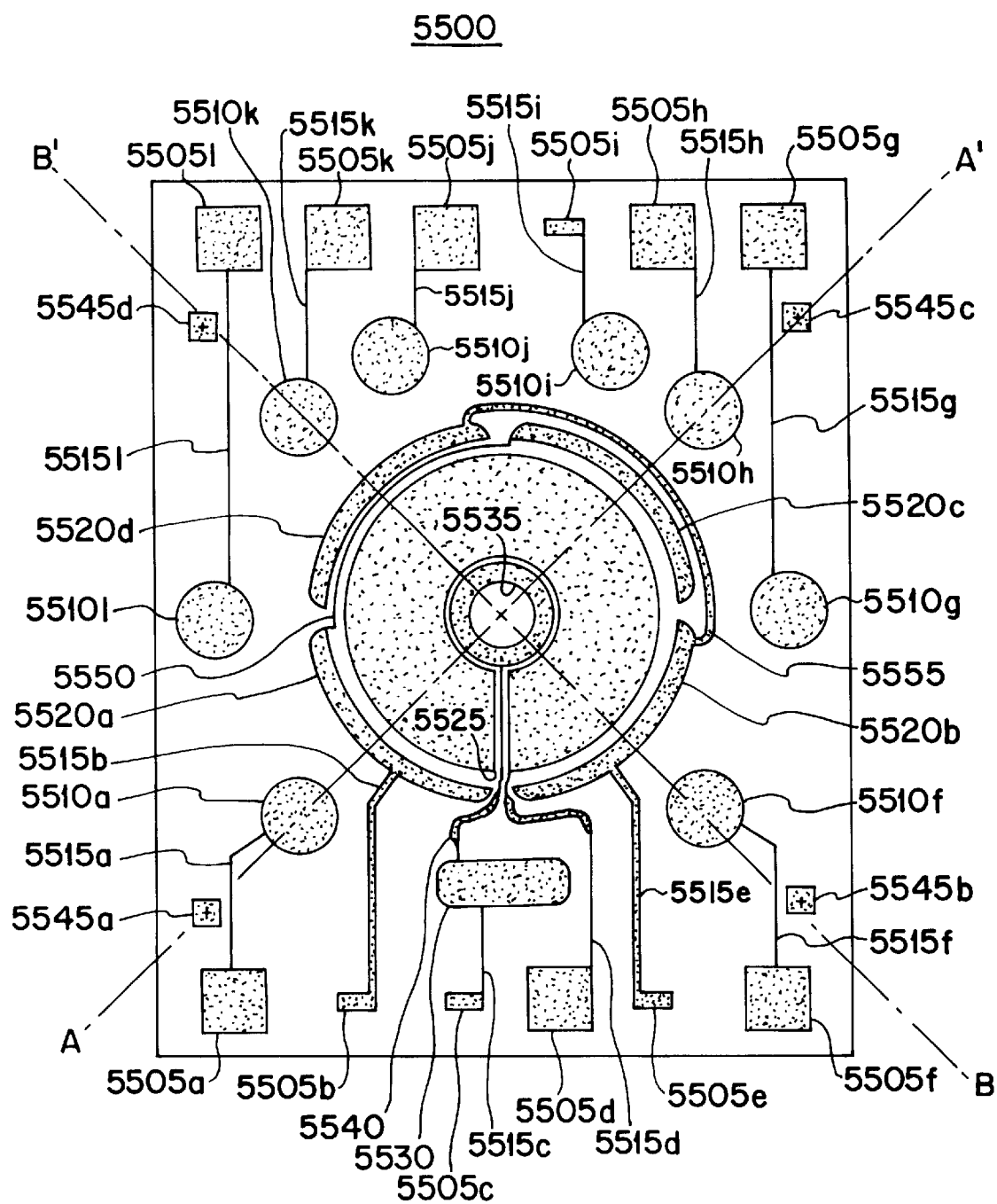

For example, it is sometimes desirable to not only control the tilt and longitudinal (z-axis) movement of the island, but also to measure the amount of tilt and z-axis movement exhibited by the island 105. Tilt and z-axis measurement can be done using capacitive sensing electrodes, and tilt control and z-axis control can be done by using a segmented drive electrode similar to the segmented electrodes shown in FIGS. 11A, 11B and 13B, where each electrode segment is individually controlled. FIGS. 13C and 13D show one example of electrode patterns that allow tilt and z-axis control, and capacitive sensing of the tilt and z-axis movement of the island 105.

FIG. 13C shows a preferred electrode pattern 5000 for the compliant mirror support 2305 As shown in FIG. 13C, the line labeled A–A' corresponds to the "roll" axis of the Compliant mirror support 2305, and the line labeled B–B' corresponds to the pitch axis of the Compliant mirror support 2305. Island 105 tilt about A–A' is referred to as "roll", and tilt along the line labeled B–B' is referred to as "pitch". Accordingly, island 105 tilt along the roll axis A–A' (i.e., roll) is perpendicular to island tilt along the pitch axis B–B' (i.e., pitch).

The electrode pattern 5000 shown in FIG. 13C includes first, second, third, and fourth alignment marks, 5045A–D, respectively. The electrode pattern 5000 also include a first through eighth inter-wafer contact 5010A, and 5010F through 5010L, respectively. The second inter-wafer contact 5010F is electrically coupled to a second set of S-leads 5060F by a second lead 5015F. The third inter-wafer contact 5010G is electrically coupled to a third set of S-leads 5060G by a third lead 5015G. In a similar fashion, the fourth inter-wafer contact 5010H, the sixth inter-wafer contact 5010J, seventh inter-wafer contact 5010K, and the eighth inter-wafer contact 5010L are coupled to their respective S-leads 5060H, 5060J, 5060K, and 5060L, by a fourth lead 5015H, sixth lead 5015J, seventh lead 5015K, and eighth lead 5015L, respectively.

For electrodes or actuator enablement, the second set of S-leads 5060F is electrically coupled to a first roll-sense electrode 5020B by a fourteenth lead 5065F. The third set of S-leads 5060G is electrically coupled to a third drive electrode 5025C by a thirteenth lead 5065G. The fourth set of S-leads 5060H is electrically coupled to a second pitch-sense electrode 5020C by a twelfth lead 5065H. The sixth set of S-leads 5060J is electrically coupled to a second drive electrode 5025B by a sixth lead 5015J. The seventh set of S-leads 5060K is electrically coupled to a second roll-sense electrode 5020D by a tenth lead 5065K. The eighth set of S-leads 5060L is electrically coupled to a first drive electrode 5025A by a ninth lead 5065L. In addition to being electrically connected to the second set of S-leads 5060F, the second inter-wafer contact 5010F is electrically coupled to a tenth set of S-leads 5060G and a ninth set of S-leads 5060A by a fifteenth lead 5070 and a seventeenth lead 5075, respectively. The tenth set of S-leads 5060G is also electrically coupled to a Z-sense electrode 5035 by a sixteenth lead 5065G. The ninth set of S-leads 5060A is electrically coupled to a first pitch-sense electrode 5020A by a nineteenth lead 5065A. The first inter-wafer contact 5010A is electrically coupled to a reference electrode 5030 by an eighteenth lead 5015A.

Referring to FIG. 13D, a preferred electrode pattern 5500 for the actuator support 2350 is shown. The electrodes on the actuator support 2350 are generally referred to as counter-electrodes. The dashed line labeled A–A' is referred to as the "roll" axis and the dashed line labeled B–B' is referred to as the "pitch" axis. Roll is where the island 105 tilts about the roll axis, and pitch is where the island 105 tilts about the pitch axis. Thus, roll and pitch are tilts of the island 105 perpendicular to one another.

The electrode pattern 5500 includes twelve pads which provide electrical contact between the Actuator support 2350 and external circuits. The first through the twelfth pad are labeled 5505A, through 5505L, respectively.

The electrode pattern 5500 also preferably includes inter-wafer contacts. Inter-wafer contacts are conductive contact points configured to provide electrical contact between the wafers when assembled. The first inter-wafer contact is 5510A, and the second through eighth inter-wafer contact are labeled 5510F–5510L respectively. A lead 5515A provides electrical contact between the first pad 5505A and the first inter-wafer contact 5510A. Another lead 5515B provides electrical contact between the second pad 5505B and a first pitch-sense counter electrode 5520A. A third lead 5515C provides electrical contact between the third pad 5505C and a reference counter electrode 5530. A fourth lead 5515D provides electrical contact between the fourth pad 5505D and a Z-sense counter electrode 5535. A fifth lead 5515E provides electrical contact between the fifth pad 5505E and a first roll-sense counter electrode 5520B. A sixth lead 5515F provides electrical contact between the sixth pad 5505F and a second inter-wafer contact 5510F. The seventh lead 5515G provides electrical contact between the seventh pad 5505G and a third inter-wafer contact 5510G. An eighth lead 5515H provides electrical contact between an eighth pad 5505H and a fourth inter-wafer contact 5510H. A ninth lead 5515I provides electrical contact between the ninth pad 5505I and a fifth inter-wafer contact 5510I. A tenth lead 5515J provides electrical contact between a tenth pad 5505J and a sixth inter-wafer contact 5510J. An eleventh lead 5515K provides electrical contact between an eleventh pad 5505K and a seventh inter-wafer contact 5510K. A twelfth lead provides electrical contact between the twelfth pad 5505L and an eighth inter-wafer contact 5510L. A thirteenth lead 5550 provides electrical contact between a first pitch-sense electrode 5520A and a second pitch-sense counter electrode 5520C. A fourteenth lead 5540 provides electrical contact between the reference counter electrode 5530 and the Z-sense counter electrode 5535. Finally, a fifteenth lead 5555 provides electrical contact between the first roll-sense counter electrode 5520B and a second roll-sense counter electrode 5520D.

The electrodes that make up the electrode pattern 5000 on the compliant mirror support 2305 are electrically connected to external circuits through the inter-wafer contacts and the pads of electrode pattern 5500. Accordingly, final electrical connections between the compliant mirror support 2305 and the actuator support 2350 are made when the compliant mirror support 2305 is attached to the actuator support 2350.

When the compliant mirror support 2305 and the actuator support 2350 are affixed to one another, the first through fourth alignment marks, 5045A through 5045D, are aligned with the first through fourth alignment marks 5545A through 5045D of the actuator support 2350 respectively. Thus, first inter-wafer contact 5510A of the compliant mirror support 2305 is brought into electrical contact with the first inter-wafer contact 5510A of the actuator support 2350. Accordingly, the second inter-wafer contact 5010F of the compliant mirror support 2305 is broaden into electrical contact with the second inter-wafer contact 5510F of the actuator support 2350. In a similar manner the remaining inter-wafer contacts three through eight, 5010G through 5010L of the compliant mirror support 2305 respectively, are brought into electrical contact with the remaining third through eighth inter-wafer contacts, 5510G through 5510L, respectively, of the actuator support 2350. Thus, the compliant mirror support 2305 electrode pattern 5000 electrically communicates with external circuits through the inter-wafer contact points and leads of the actuator support 2350 electrode pattern 5500.

In operation, respective sets of electrodes and corresponding counter-electrodes for capacitive sensing and driving can be accessed by appropriate selection of pads one through twelve, 5505B through 5505L, respectively, on the actuator support 2350. It should be noted that the various pads one through twelve, 5505A through 5505L, communicate with more than one electrode or counterelectrode on the compliant mirror support 2305 and actuator support 2350, however the functionality of certain electrodes is further selected by energizing the appropriate counter electrode. For example, the third pad 5505C of the actuator support 2350 is connected to the reference counter electrode 5530 and the Z-sense electrode 5535, whereas the first pad 5505A of the actuator support 2350 is connected to the reference electrode 5030 of the compliant mirror support 2305 through the set of first inter-wafer contacts 5510A and 5010A, respectively. However, the first pad of the actuator support 2350 5505A does not electrically communicate with the Z-sense counter-electrode 5535 of the actuator support 2350. Thus, the capacitance between reference counter electrode 5530 of the actuator support 2350 and the reference electrode 5030 of the compliant mirror support 2305 may be measured via the first and third pads 5505A and 5505C of the actuator support 2350.

It should also be noted that all capacitance measurements can be relative capacitance measurements, where the capacitance between two pairs of capacitance plates are simultaneously measured and referenced against one another. Thus, when measuring pitch of the island 105, the capacitance between the first pitch-sense counter-electrode 5520A of the actuator support 2350 and the first pitch-sense electrode 5020A of the compliant mirror support 2305 is compared with a capacitance between the second pitch-sense counter electrode 5520C of the actuator support 2350 and the second pitch-sense electrode 5020C of the compliant mirror support 2305. Likewise, the capacitive measurement of the Z-sense counter electrode 5535 of the actuator support 2350 and the Z-sense electrode 5035 of the compliant mirror support 2305 is referenced against the capacitance between the reference counter electrode 5530 of the actuator support 2350 and the reference electrode 5030 of the compliant mirror support 2305.

For purposes of displacing or tilting the island 105 the first, second, and third drive electrodes of the compliant mirror support 2305, 5025A, 5025B, and 5025C, respectively, cooperate with the common drive counter electrode 5525 of the actuator support 2350 to move the island 105 with respect to the frame 115.

Figure 14A:
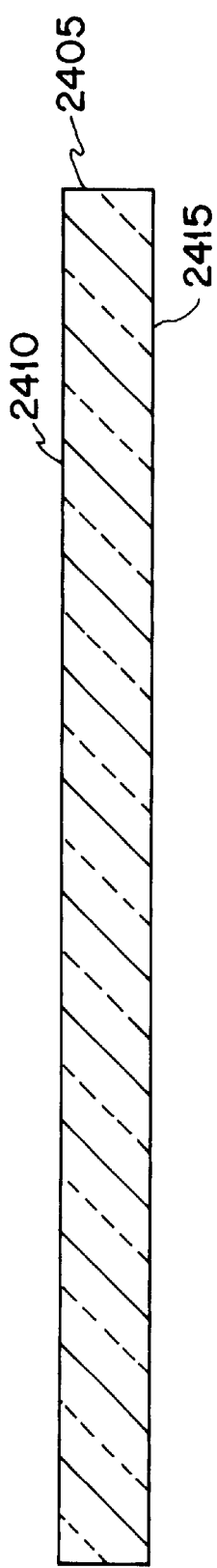
FIGS. 14A–14N are cross-sectional views of steps in one preferred method of fabricating the actuated mirror of FIG. 13A.
Figure 14B:
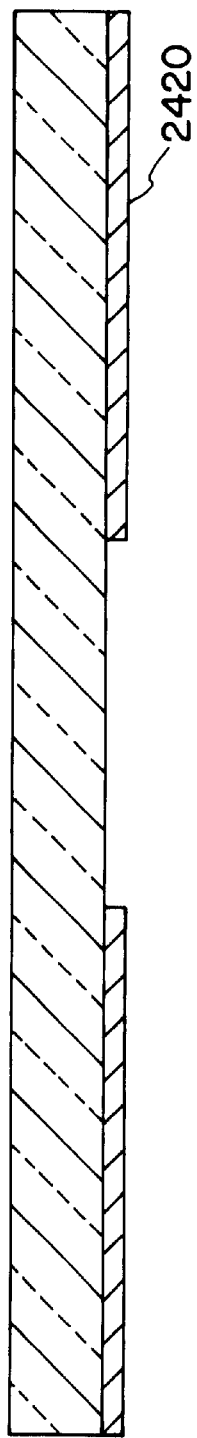
Figure 14C:
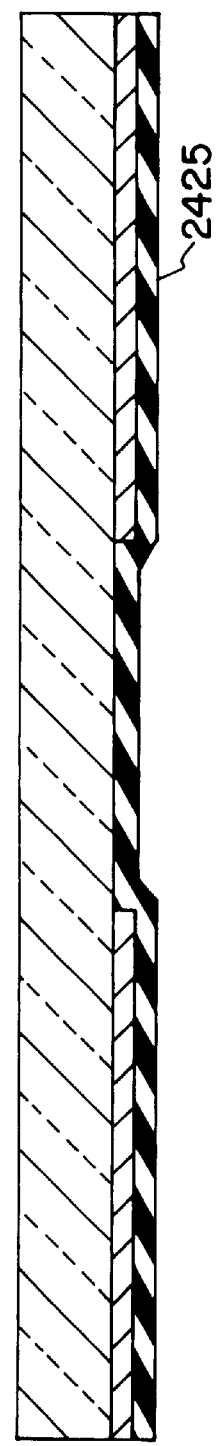
Figure 14D:
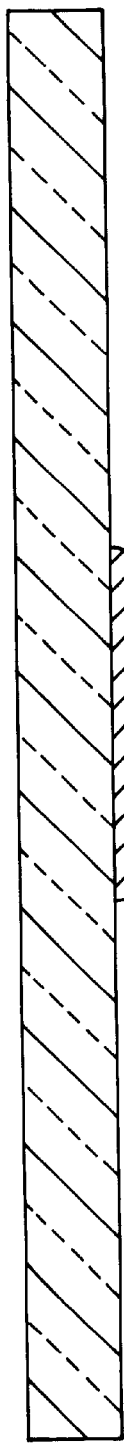
Figure 14E:
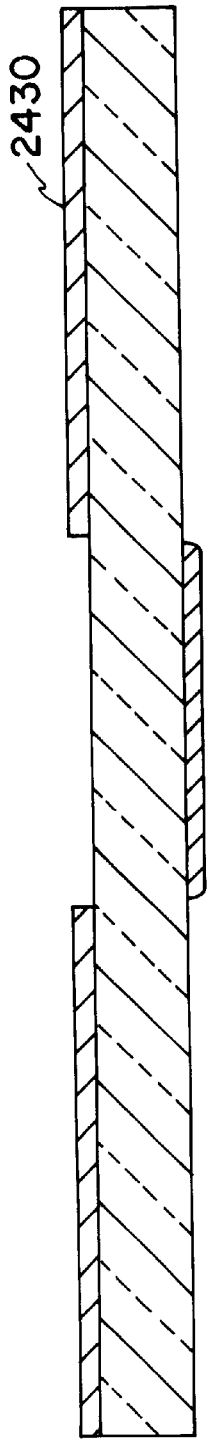
Figure 14F:
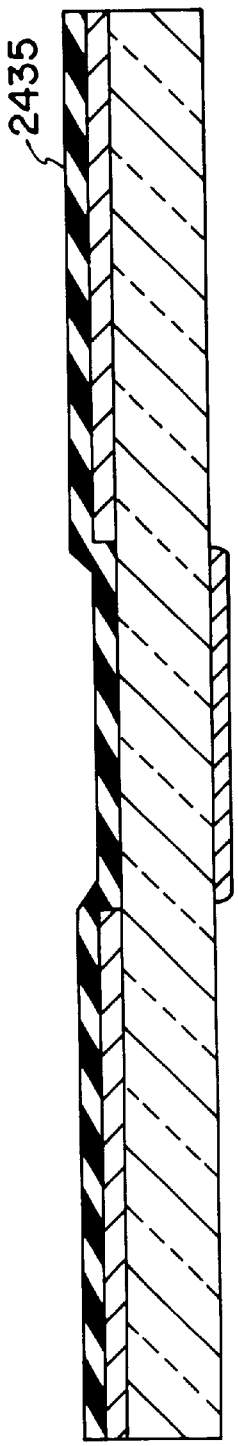
Figure 14G:
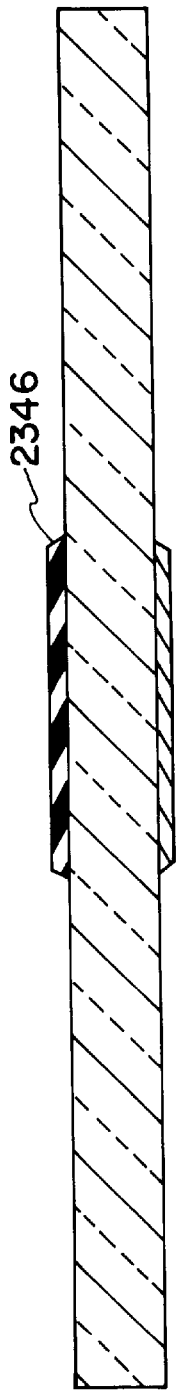
Figure 14H:
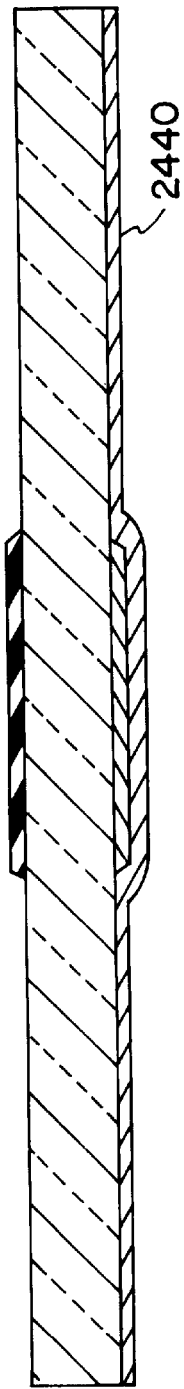
Figure 14I:
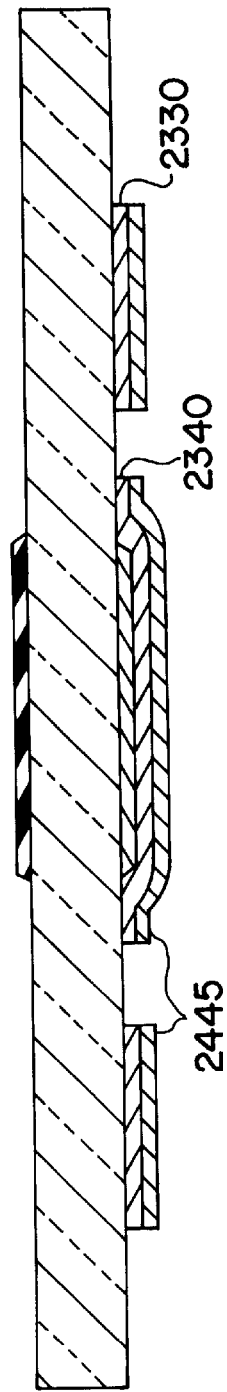
Figure 14M:
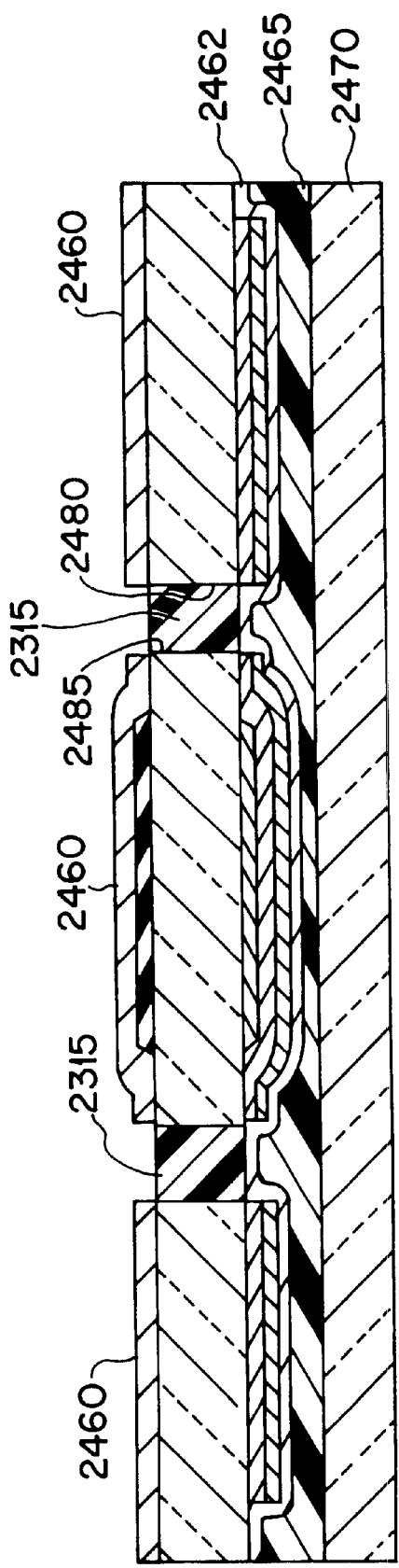
Figure 14N:
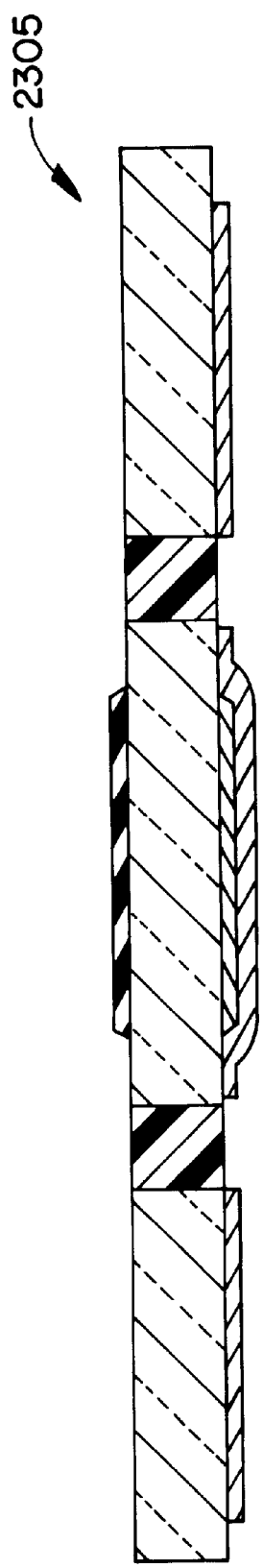

FIGS. 14A through 14N are cross-sectional views of steps in one preferred method of fabricating the actuated mirror 2300 of FIG. 13A. It should be appreciated that, although FIGS. 14A–14N illustrate the fabrication of a single actuated mirror, the fabrication process is designed so that a plurality of actuated mirrors can be fabricated simultaneously on a single wafer. The method is preferably implemented with standard photolithographic processing techniques. FIGS. 14A through 14N provide an example of a particularly advantageous feature of preferred embodiments of the invention. Embodiments of the present invention are particularly suitable for manufacturing in quantity by manufacturing multiple compliant mechanisms in parallel from a single wafer of material, such as silicon. Further, embodiments of the present invention provide for manufacturing each layer separate from the other layer and subsequently assembling the layers into multi-layer mechanisms. Such separate manufacture of each layer allows for materials and processing steps to differ substantially in each layer.

As shown in FIG. 14A, the fabrication method begins by providing a double-side polished silicon wafer 2405 which is preferably approximately half a millimeter thick. As discussed above, although silicon is used in one preferred embodiment of the present invention, any of the materials known in the art that are compatible with micro-electromechanical manufacturing techniques may be used. The silicon wafer 2405 has a first side 2410 and a second side 2415. Both of these sides are preferably polished.

Next, as shown in FIG. 14B, the second side 2415 of the silicon wafer 2405 is coated and patterned with a first photoresist layer 2420. Then, as shown in FIG. 14C, a first high reflectivity coating 2425 is deposited onto the first photoresist 2420.

In FIG. 14D, the first photoresist 2420 is removed, thereby leaving sections of the first high reflectivity coating 2425 in a pattern which corresponds to the first patterned photoresist layer 2420.

After the first photoresist 2420 is removed, a second photoresist 2430 is added to the first side 2410 of the silicon wafer 2405 as shown in FIG. 14E. Then, the second photoresist 2430 is patterned with a prescribed pattern. Next, as shown in FIG. 14F, an anti-reflectivity coating 2435 is deposited onto the first side 2410 of the silicon wafer 2405 over the photoresist 2430. FIG. 14H next shows the deposition of an actuator metal 2440. Then as shown in FIG. 14I the actuator metal 2440 is coated with a photoresist 2445. After coating the actuator metal 2440, the photoresist 2445 is patterned and removed. Next, the silicon wafer 2405 is subjected to an etching process where the actuator metal 2440 is removed in a pattern corresponding to the pattern of the photoresist 2445, thus forming an island actuator 2455 and an island actuator lead 2450 out of the actuator metal 2440.

After the island actuator 2455 and the island actuator 2450 lead are formed, a first side 2410 of the silicon wafer 2405 is coated with a photoresist 2460, as shown in FIG. 14I. As illustrated in FIG. 14J, an etch stop layer 2462 is formed on the second side 2415 of the wafer 2405 prior to releasably attaching the wafer 2405 to a carrier wafer 2470. The etch stop layer 2462 is particularly preferred when deep reactive ion etching (DRIE) is employed to form the continuous trench 2475. The etch stop layer 2462 is preferably formed of a material that is sufficiently different from the other materials in the wafer 2405 and coating layers formed thereon such that the etch stop layer 2462 can be removed following fabrication without damaging the other materials. Preferably, the etch stop layer 2462 is metal or a metal alloy. More preferably, the etch stop layer 2462 is aluminum. The etch stop layer 2462 protects the substrate 2405 and the means by which the wafer is releasably attached to the carrier wafer 2470, e.g., a water soluble wax 2465, from being etched during DRIE processing. Additionally, the etch stop layer 2462 may be patterned, e.g., dimpled or cross-hatched, to impart a desired surface morphology to the compliant member 110 following removal of the etch stop layer 2462.

Photoresist 2460 is then patterned and removed. Next, as shown in FIG. 14K, a silicon wafer 2405 is attached to a carrier wafer 2470 preferably using a water soluble wax 2465. The silicon wafer 2405 is attached to the carrier wafer 2470 on the second side 2415 of the silicon wafer 2405. Although other methods can be used to attach the silicon wafer 2405 to the carrier wafer 2470, water soluble wax 2465 is preferred due to its ease of removal and because water has little or no effect on the other materials which are used to construct the compliant optical support. Then, FIG. 14L shows the results of a DRIE etch step, where a trench 2475 is etched into the silicon wafer 2405. The etching of the trench 2475 forms the island 2480 and the frame 2485 of the compliant optical support. As indicated by FIG. 14L, because the silicon wafer 2405 was attached to the carrier wafer 2470 with the water soluble wax 2465, the island 2480 is held in proper registration with the surrounding frame 2485 after the trench 2470 has been etched, thus detaching the island 2480 from the frame 2485. Further, by using a relatively thin layer of wax and using Helium or gas or other cooling method under the carrier wafer, the temperature of the structure can be maintained low enough during etching to prevent melting of the wax.

While the silicon wafer 2405 remains attached to the carrier wafer 2470, the trench 2475 is filled with a material which will form the compliant member 2490. The material of the compliant member 2490 is preferably injected into the trench 2475 in a liquid state, and cured such that the resulting compliant member 2490 is bonded to the walls of the trench 2475. The material for the compliant member 2490 can be injected using a hollow needle. The injection process can further be aided by etching guide channels into the silicon wafer 2405 to assist in guiding the injected liquid into the trench 2475. The inner perimeter of the frame and outer perimeter of the island function as sides of a mold for the elastomer. The etch stop, wax and carrier wafer 2470 function as the bottom of the mold. The elastomer is filled preferably to near the top of the trench. It should be appreciated that the ability to partially fill the trench with less material provides flexibility in choosing characteristics of the compliant member and the ultimate apparatus.

Finally, in FIG. 14N, the water soluble wax 2465 is dissolved, freeing the now completed compliant optical support 2495 from the carrier wafer 2470. While water soluble wax 2465 is the preferred bonding agent between the silicon wafer 2405 and the carrier wafer 2470, other types of releasable agents may be used such as non-water soluble wax, adhesives, vacuums, etc. Once the compliant optical support 2495 is released from the carrier wafer 2470, the etch stop layer 2462 may be removed.

Figure 15A:
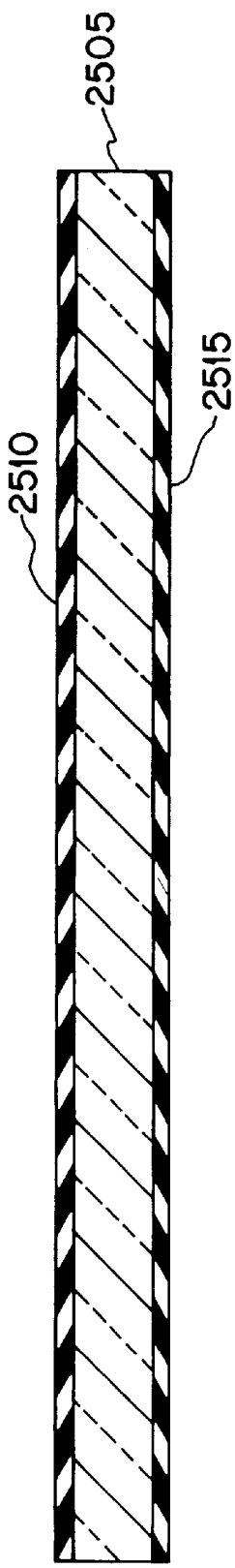

FIGS. 15A through 15L are cross-sectional views of steps of one preferred method of fabricating the actuator support 2350 shown in FIG. 13. Creating the actuator support 2350 of FIG. 13 starts with a silicon wafer 2505 of FIG. 15A. The silicon wafer is preferably half a millimeter thick, although FIG. 15A shows a silicon wafer 2505, a wafer of any material susceptible to micro-electromechanical systems may be employed. Additionally, a thickness of half a millimeter for the silicon wafer is preferred but other thicknesses may be used as well.

The first step of creating the actuator support includes depositing upon the silicon wafer 2505 a first silicon nitride layer 2510 on one side of the silicon wafer 2505 and a second silicon nitride layer 2515 on the other side of the silicon wafer 2505. Although the first and second silicon nitride layers 2510 and 2515 are shown, any suitable non-conducting material may be applied to the silicon wafer 2505. First and second silicon nitride layers 2510 and 2515 are deposited to a thickness of approximately 2,000 angstroms. Although 2,000 angstroms is the preferred thickness, other thicknesses may be used as well, especially when other materials are used to create the first and second layers 2510 and 2515.

Figure 15B:
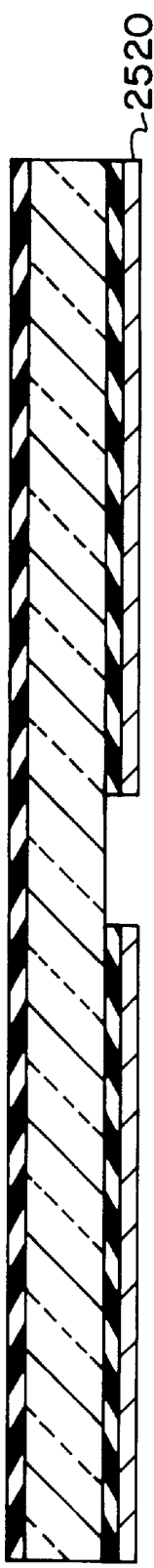
Figure 15C:
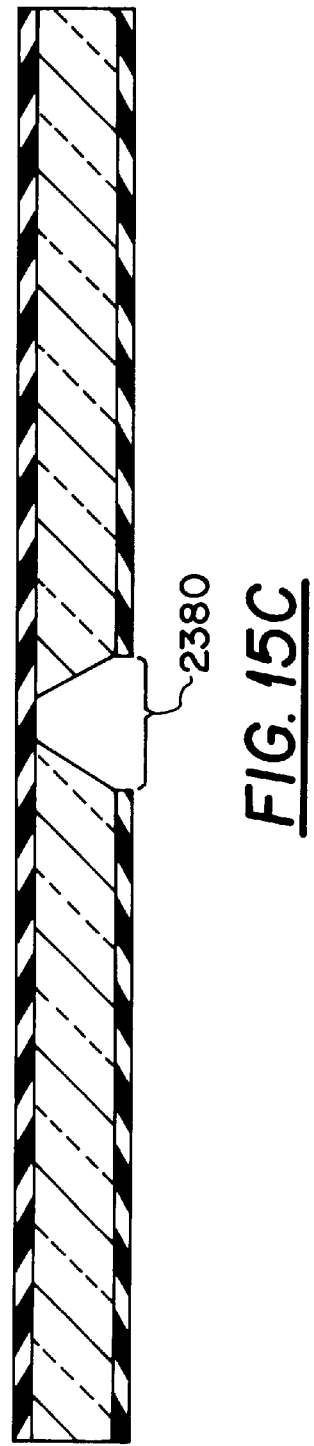

In the next step, FIG. 15B shows coating the second layer 2515 with a photoresist and patterning mask 2520. After the photoresist 2520 is applied and patterned, the second layer 2515 is etched in a pattern corresponding to the patterning of the photoresist 2520. After etching through the second layer 2515 as illustrated in FIG. 15C, a potassium hydroxide solution or other anisotropic etching solution is used to etch through the silicon wafer 2505 to form the actuator support aperture 2520.

Figure 15D:
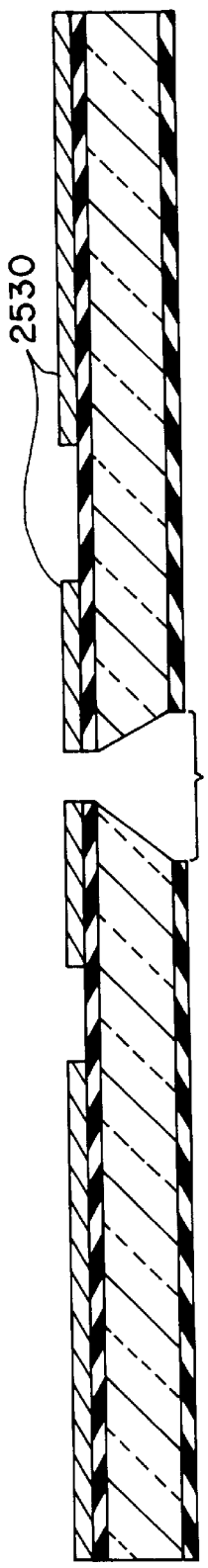
Figure 15E:
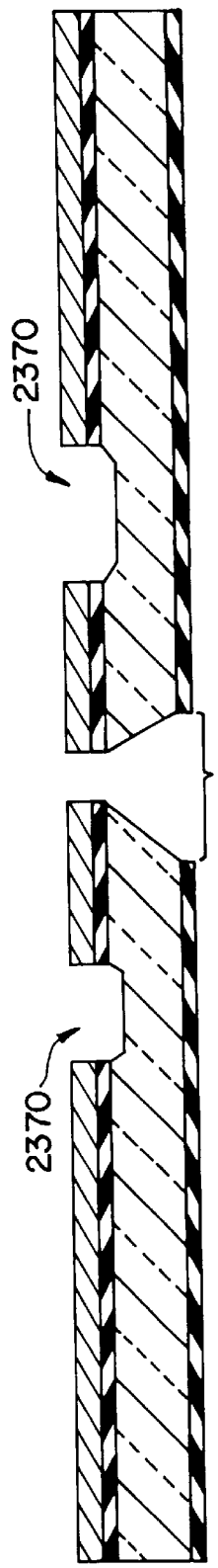
Figure 15F:
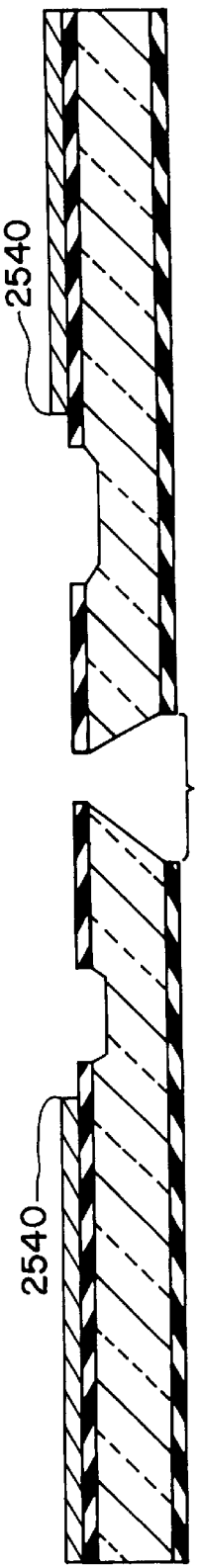

FIG. 15D shows applying a photoresist 2530 to a first layer 2510, patterning the photoresist and then etching through the first layer 2510. In the case where the first layer 2510 is silicon nitride, this etching step would involve a silicon nitride etching process. Then, the actuator frame recesses 2535 is formed by etching through the first layer 2510 and etching trenches into the silicon wafer 2505, as shown in FIG. 15E. After the trenches are formed the photoresist 2530 is removed and coating and patterning a spacer material 2540 onto the first layer 2510 as shown in FIG. 15F.

Figure 15G:
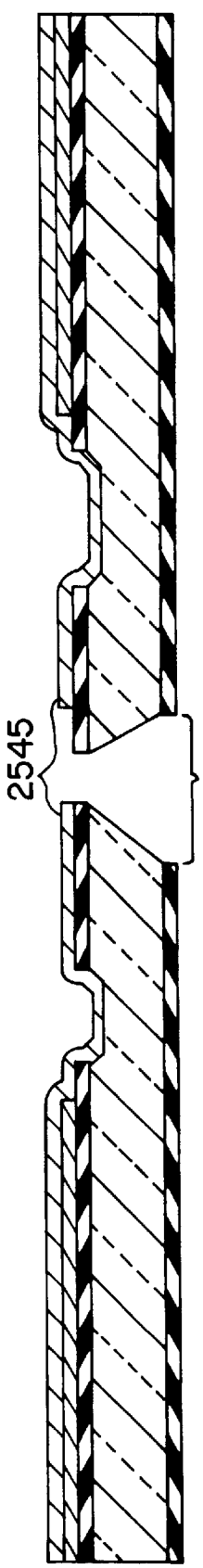
Figure 15H:
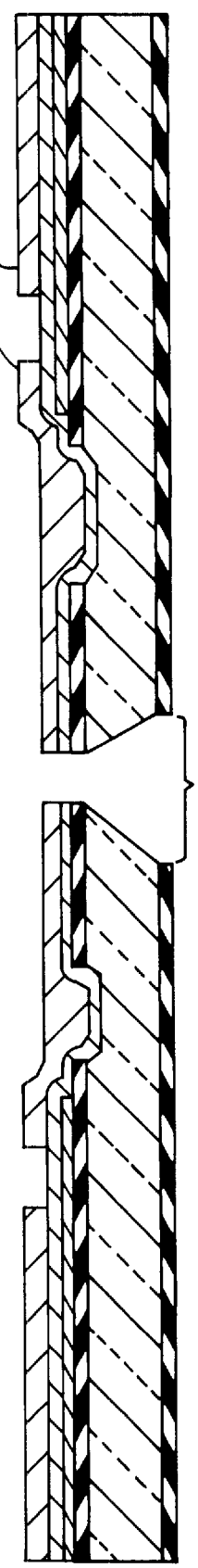
Figure 15I:
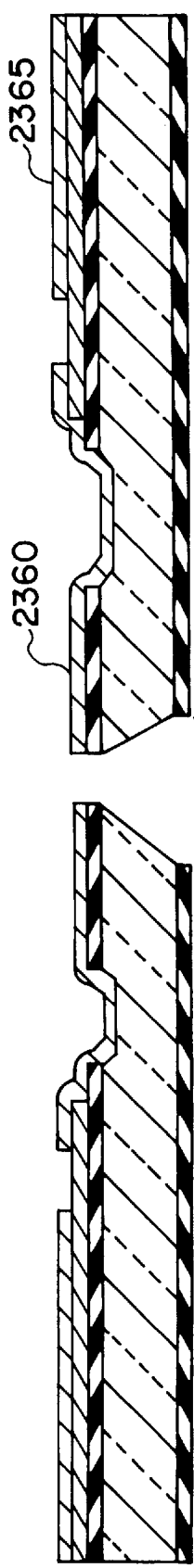

FIG. 15G shows forming a deposit over the spacer material 2540, the first layer 2510 and the actuator frame recesses 2535 with an actuator metal 2545. Next, FIG. 15H shows coating and patterning the actuator metal 2545 with a photoresist 2550. Then, FIG. 15H shows the step of etching the electrode metal 2545 to form a stationary actuator 2555 and stationary actuator leads 2560.

Finally, in the last set of steps, FIG. 15J shows depositing and patterning a photoresist 2565 to form solder lift-offs. After the solder lift-offs are formed, solder metal 2570 is deposited over the photoresist 2565 as shown in FIG. 15K. Finally, FIG. 15L shows removing the photoresist and adjacent solder to form the spacer 2475 of the now completed actuator support 2580.

Figure 16:
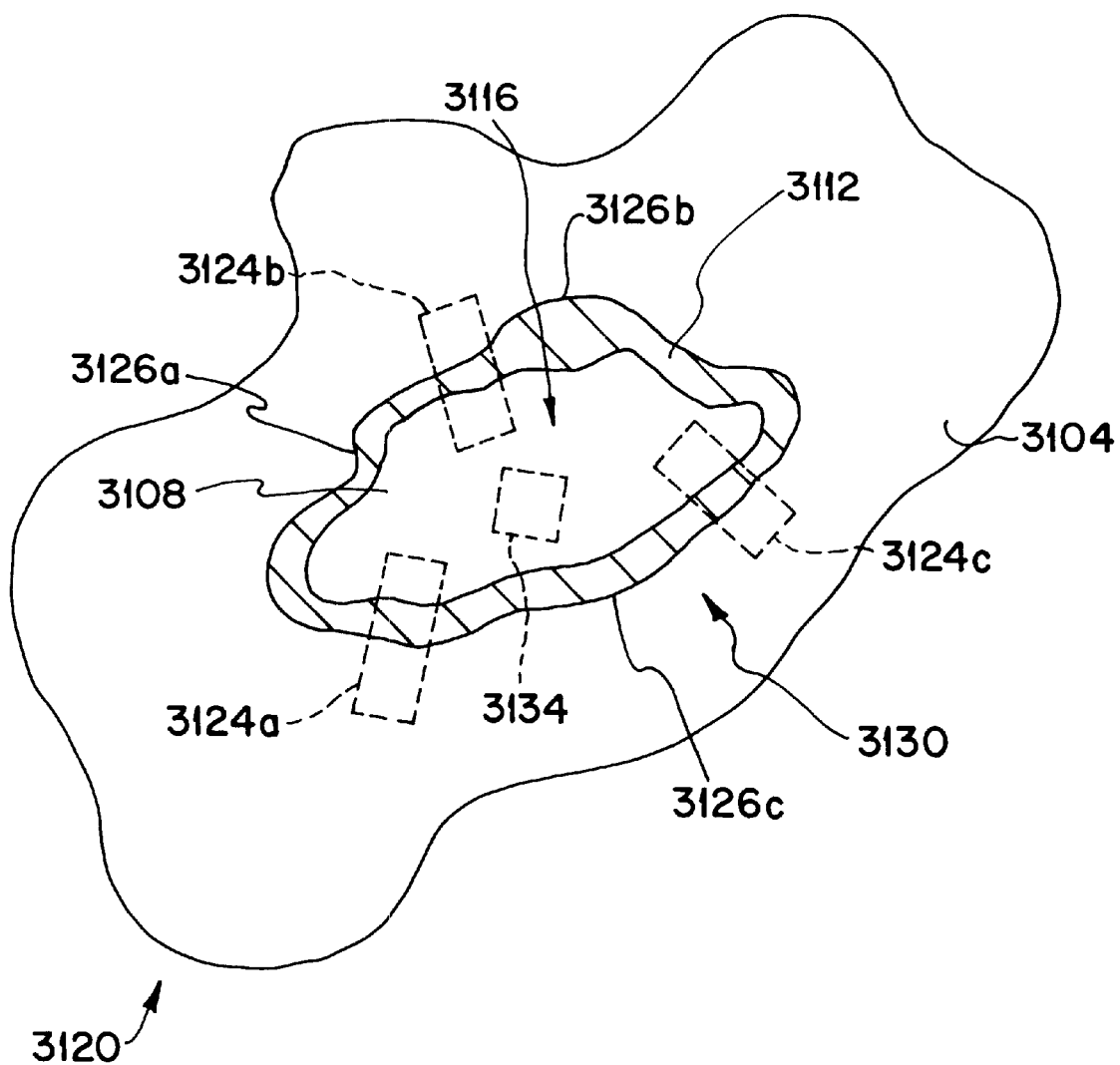
FIG. 16 is a schematic representation of a displaceable inner member mounting structure, in accordance with an embodiment of the present invention.
Figure 17:
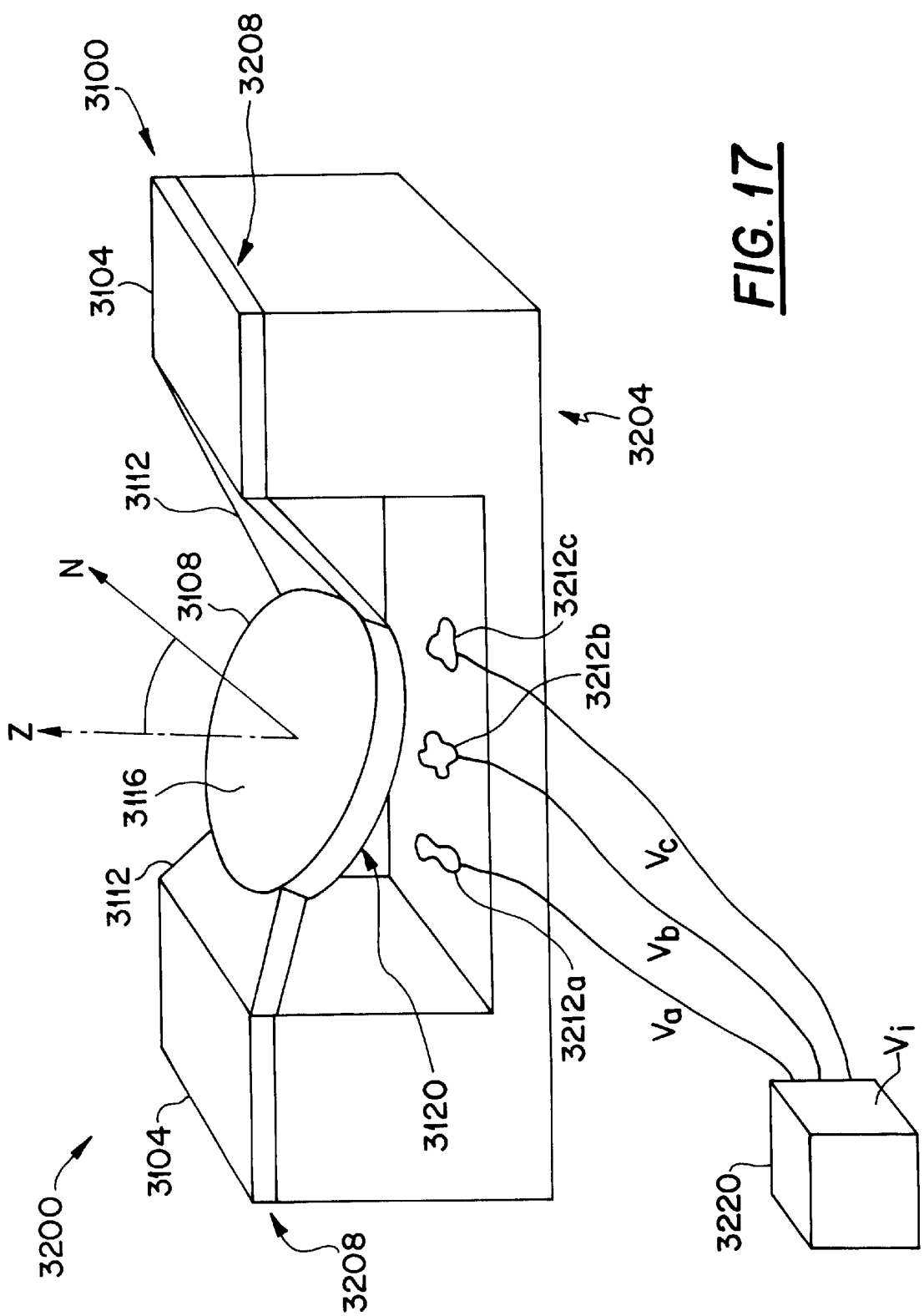
FIG. 17 is a perspective view of an inner member device having a controllable displaceable inner member, in accordance with an embodiment of the present invention.
Figure 18:
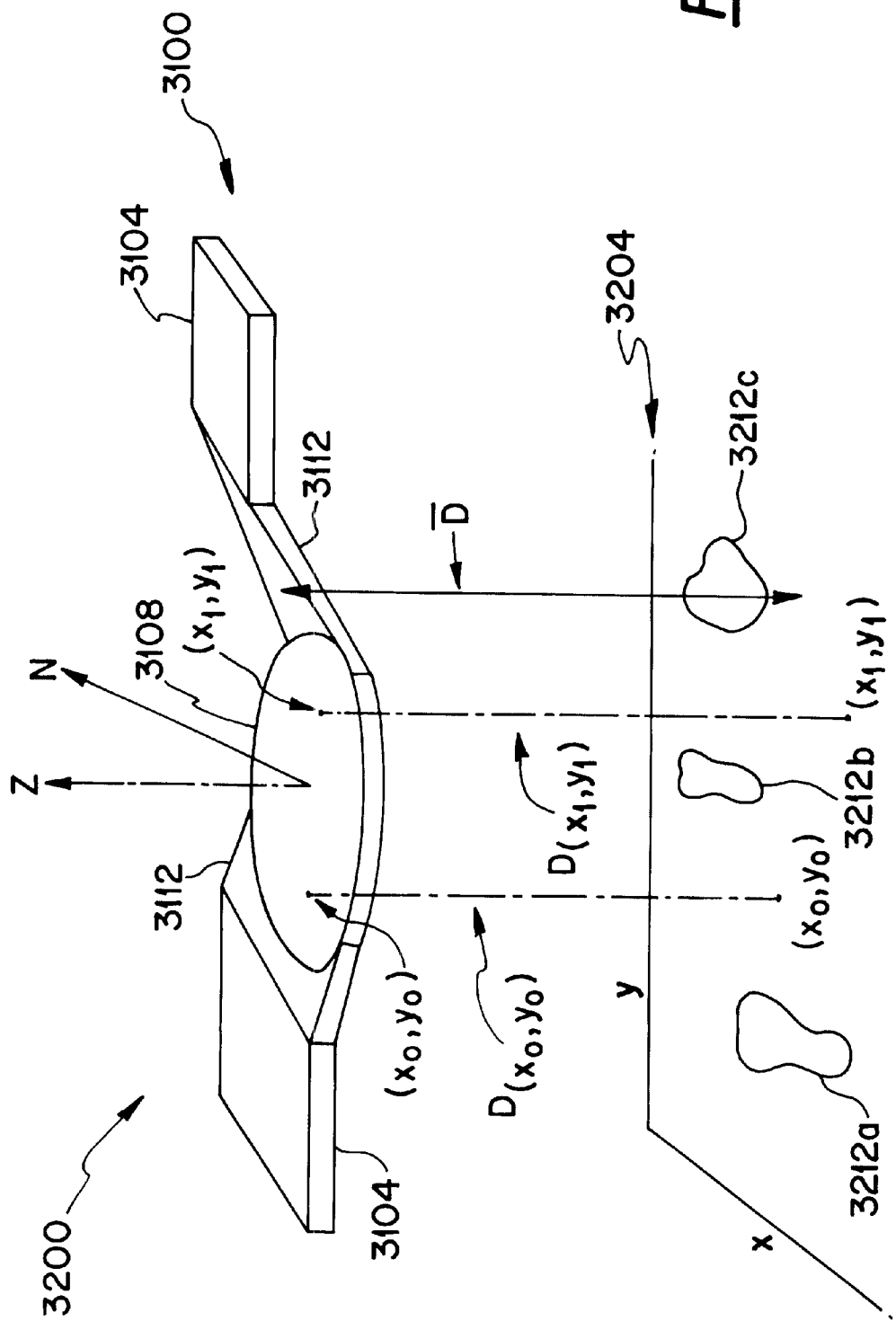
FIG. 18 is a perspective view the inner member device shown in FIG. 17, with a coordinate axis replacing the displacement controller member.

Other generalized embodiments of the invention are shown in FIGS. 16 thru 18. FIG. 16 shows a displaceable inner member mounting structure 3100 according to one embodiment of the invention. Displaceable inner member mounting structure (mounting structure) 3100 includes an outer member 3104, an inner member 3108 and a non-rigid attaching material 3112 that attaches outer member 3104 to inner member 3108. Non-rigid attaching material (non-rigid material) 3112 attaches inner member 3108 to outer member 3104. Inner member 3108 has a top 3116 and a bottom 3120 (not visible in the FIG. 16). Non-rigid material 3112 is selected to be material which in addition to attaching inner member 3108 to outer member 3104, also enables inner member 3108 to be displaceable with respect to outer member 3104. Non-rigid material 3112 preferably has a Young's modulus that is smaller than the Young's modulus of outer member 3104, and preferably less than 10 G Pascal.

In a preferred embodiment, inner member 3108 and outer member 3104 are made of at least semi-rigid material and preferably rigid material. Also, inner member 3108 and outer member 3104 can be approximately planar. In a preferred embodiment of the invention, non-rigid material 3112 can include an elastic type material which enables inner member 3108 to be displaced from a neutral position with respect to outer member 3104 when some type of force or torque is applied to inner member 3108. In a preferred embodiment, inner member 3108 should be capable of returning approximately to a neutral position once the force or torque is no longer present. However, embodiments where the inner member 3108 is biased or offset such that it does not return to a neutral position once the force or torque is no longer present fall within the scope of the invention.

FIG. 16 illustrates one embodiment of the invention in which non-rigid material 3112 completely surrounds inner member 3108. It should be appreciated, however, that alternative embodiments may include only sections 3124a, 3124b, and 3124c of non-rigid material 3112. FIG. 16 depicts three such sections but any number of such sections may be used, provided inner member 3108 can be displaced with respect to outer member 3104. Sections 3124a–c would be separated by sections 3126a–c which may be empty trenches or trenches filled with other materials. For example, if only section 3124a were filled with non-rigid material, the island could be made to pivot around section 3124a.

Inner member 3108 can be a single element or a material with multiple coatings of optical surfaces arranged on its top 3116 and/or on its bottom 3120. Inner member 3108 is made of a rigid material which may or may not be the same as a material of outer member 3104.

Non-rigid material 3112 is preferable stretchable and/or compressible. Sections 3124a–c together with sections 3126a–c in the absence of non-rigid material 3112 form a trench 3130. Accordingly, inner member 3108 can be considered a type of island member. Inner member 3108 may have one or more apertures 3134 which could be used to pass optical or other wavelengths of electromagnetic radiation. Trench 3130 and aperture 3134 could be formed in a variety of ways including mechanical drilling, laser ablation, or a variety of mcroelectronic device fabrication techniques such as etching.

FIG. 17 shows an inner member device having a controllable displaceable inner member 3200 which includes mounting structure 3100 and a displacement controller member 3204. Mounting structure 3100 is attached to displacement controller member 3204 via outer member 3104 at locations 3208. This enables inner member 3108 to be displaced with respect to both outer member 3104 and displacement controller member 3204. According to one embodiment of the invention, inner member 3108 may include a conductive material either on top 3116 and/or on bottom 3120 and displacement controller member 3204 may include one or more electrodes 3212a–c. A voltage controller 3220 can be electrically coupled to electrodes 3212a–c and/or the conductive component of inner member 3108 to create and control the potential difference between a conductive portion of inner member 3108 and electrodes 3212a–c.

Voltage controller 3220 outputs one or more position controlling voltages $V_i$. As illustrated in FIG. 17, voltage controller 3220 outputs position controlling voltages $V_a$, $V_b$, and $V_c$ to electrodes 3212a, 3212b, and 3212c, respectively. For purposes of this discussion, position controlling voltage $V_i$ represents the relative voltage between the conductive portion of inner member 3108 and a respective electrode. Hence, the actual output voltage and voltage controller 3220 with respect to ground may or may not be the same as the potential difference between a respective electrode and a conductive portion of inner member 3108. The actual voltage will be the same as position controlling voltage $V_i$ when the connective portion of inner member 3108 is at ground.

FIG. 18 shows device 3200 with a coordinate axis replacing displacement controller member 3204. The position of inner member 3108 can be defined by the separation distance D(x, y). Separation distance D(x, y) will vary depending on the position of inner member 3108 with respect to displacement controller member 3204. Referring to FIG. 17 as well as FIG. 18, as voltage controller 3220 adjusts the potential difference or magnetic field strength in the case of electromagnetic actuation between inner member 3108 and electrodes 3212a–c, the position of inner member 3108 can be adjusted with at least 3 degrees of freedom. The relative positions of electrodes 3212a–c as well as the relative voltage differences, and the type of non-rigid material 3112 ultimately determine the separation distance D(x, y) and accordingly the position of inner member 3108 with respect to displacement controller member 3204.

The sensitivity of inner member 3108 to changes in voltage $V_i$ depends on these same factors as well as the average distance $\overline{D}$ of inner member 3108 from displacement controller member 3204. The smaller the value of $\overline{D}$, the more sensitive inner member 3108 becomes to changes in voltage controller potentials $V_i$. Accordingly, separation distance D(x, y), and consequently the position of inner member 3108, is ultimately a function of position controlling voltage $V_1$.

The aspect ratio of the non-rigid material 3112 in the embodiments of FIGS. 17 and 18 are shown as being less than one. For embodiments where the width is greater than or equal to ten times the height, the restoring force and related characteristic are typically characterized by tensile deformation. Where the width is between one and ten times the height, the operating characteristics typically are characterized by a blend of tensile and shear deformation. However, as discussed above, the non-rigid material 3112 can have an aspect ratio greater than one (i.e. width less than height) while still falling within the scope of the present invention. An aspect ratio of greater than one would cause the embodiments shown in FIGS. 17 and 18 to operate in shear mode.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An apparatus, comprising:
    an island member comprising a top, a bottom, and an island perimeter;
    a non-rigid material attached to the island perimeter; and
    a support member surrounding the island perimeter and attached to the non-rigid material, wherein the non-rigid material enables movement of the island member with respect to the support member.

2. The apparatus of claim 1, wherein the non-rigid material comprises an annular member having an inner perimeter of a first shape that approximately surrounds the island perimeter, and an outer perimeter of a second shape, wherein the inner annular member perimeter is attached to the island perimeter.

3. The apparatus of claim 2, wherein a shape of the island perimeter is substantially the same as a shape of the inner annular member perimeter.

4. The apparatus of claim 1, wherein the support member comprises a frame.

5. The apparatus of claim 1, wherein the top of the island member is at least partially reflective.

6. The apparatus of claim 1, wherein the non-rigid material has a Young's modulus that is smaller than a Young's modulus of the island member.

7. The apparatus of claim 1, wherein the non-rigid material comprises an elastomer.

8. The apparatus of claim 1, wherein the non-rigid material exhibits substantially linear-elastic behavior over an operational frequency range of the apparatus.

9. The apparatus of claim 1, wherein the island perimeter comprises at least one protrusion that extends radially outward from the island.

10. The apparatus of claim 9, wherein the support member comprises at least one indentation, wherein the at least one protrusion protrudes at least partially into the indentation.

11. The apparatus of claim 1, wherein the support member comprises at least one protrusion which extends towards the island member.

12. The apparatus of claim 11, wherein the island member comprises at least one indentation, wherein the at least one indentation is configured such that the at least one protrusion protrudes at least partially into the indentation.

13. The apparatus of claim 1, wherein the island member has multiple protrusions and multiple indentations, and the support member has corresponding multiple indentations and corresponding multiple protrusions, wherein each protrusion of the island members protrudes at least partially into a corresponding indentation on the frame member and each protrusion of the frame member protrudes at least partially into a corresponding indentation on the island member.

14. A movable mechanism, comprising:
   a spring comprising a sleeve of elastic material with an outer surface and an inner surface, wherein the inner surface defines an aperture through an axis of the spring;
   a planar member comprising a planar body with an outer edge, wherein the planar member is disposed in the aperture of the spring and the outer edge of the planar member is attached to the inner surface of the spring; and
   a substantially rigid support member surrounding the spring and affixed to the outer surface of the spring.

15. The movable mechanism of claim 14, wherein a shape of the outer edge of the planar member is substantially the same as a shape of the inner surface of the spring.

16. The movable mechanism of claim 15, wherein the shapes of the outer edge of the planar member and the inner surface of the spring are substantially circular.

17. The movable mechanism of claim 14, wherein a top of the planar member is at least partially reflective.

18. The movable mechanism of claim 14, wherein the elastic material has a Young's modulus that is smaller than a Young's modulus of the planar member.

19. The movable mechanism of claim 14, wherein the elastic material comprises an elastomer.

20. The movable mechanism of claim 14, wherein the elastic material exhibits linear-elastic behavior over an operational frequency range of the movable mechanism.

21. The movable mechanism of claim 14, wherein the axis of the spring is a substantially central axis of the spring and the planar member is substantially circular.

22. An actuated mechanism, comprising:
   a movable mechanism, comprising:
      an island member having a top, a bottom and an island perimeter,
      a non-rigid material attached to the island perimeter, and
      a support member surrounding the island perimeter and attached to the non-rigid material, wherein the non-rigid material enables movement of the island member with respect to the support member; and
   an actuator configured and positioned to move the island member in response to a control signal.

23. The actuated mechanism of claim 22, wherein the actuator comprises an electrostatic actuator.

24. The actuated mechanism of claim 23, wherein the actuator comprises:
   at least one electrode positioned on the top or bottom of the island member; and
   at least one electrode disposed on an actuator support.

25. The actuated mechanism of claim 24, wherein the actuator support comprises a silicon substrate.

26. The actuated mechanism of claim 22, wherein at least a portion of the actuator is attached to the island member.

27. The actuated mechanism of claim 22, wherein the non-rigid material comprises an annular member having an inner perimeter of a first shape that approximately surrounds the island perimeter, and an outer perimeter of a second shape, wherein the inner annular member perimeter is attached to the island perimeter.

28. The actuated mechanism of claim 27, wherein the shape of the island perimeter is substantially the same as a shape of the inner annular member perimeter.

29. The actuated mechanism of claim 22, wherein the island perimeter has a substantially circular shape.

30. The actuated mechanism of claim 22, wherein the support member comprises a frame.

31. The actuated mechanism of claim 22, wherein the top of the island member is at least partially reflective.

32. The actuated mechanism of claim 22, wherein the non-rigid material has a Young's modulus that is smaller than a Young's modulus of the island member.

33. The actuated mechanism of claim 22, wherein the non-rigid material comprises an elastomer.

34. The actuated mechanism of claim 22, wherein the non-rigid material exhibits linear-elastic behavior over an operational frequency range of the apparatus.

35. The actuated mechanism of claim 22, wherein the island perimeter is generally serpentine-shaped.

36. An apparatus, comprising:
   an island member comprising a top, a bottom and an island perimeter;
   a support member at least partially surrounding the island perimeter; and
   a volume of non-rigid material molded to at least supportion of the island perimeter and molder to at least a portion of said support member, wherein the non-rigid material enables movement of the island with respect to the support member.

37. The apparatus of claim 36, wherein the island perimeter has a substantially circular shape.

38. The apparatus of claim 36, wherein the non-rigid material has a Young's modulas that is smaller than a Young's modulas of the island member.

39. The apparatus of claim 36, wherein the non-rigid material comprises an elastomer.

40. The apparatus of claim 36, wherein the non-rigid material completely surrounds the island member.

41. A method of forming an apparatus, comprising the steps of:
   providing a substrate comprising a first material;
   removing a volume of said first material to form an island and a support member in such substrate;
   filling at least a portion of said volume with a non-rigid second material, wherein the second material enables movement of the island member with respect to the support member and also provides a restoring force tending to restore the island to an initial position.

42. An apparatus, comprising:

a layer comprising a first material and a second material, said first material comprising,
- an island member comprising a top, a bottom, and an island perimeter, and
- a support member at least partially surrounding the island perimeter, said second material comprising a volume of non-rigid material attached to at least a portion of the island perimeter and attached to at least a portion of said support member, wherein the non-rigid material enables movember of the island member with respect to the support member.

* * * * *